(12) United States Patent
Wenham et al.

(10) Patent No.: US 9,190,556 B2
(45) Date of Patent: Nov. 17, 2015

(54) ADVANCED HYDROGENATION OF SILICON SOLAR CELLS

(71) Applicant: NewSouth Innovations Pty Limited, UNSW Sydney, NSW (AU)

(72) Inventors: Stuart Ross Wenham, Cronulla (AU); Phillip George Hamer, Kensington (AU); Brett Jason Hallam, Bexley (AU); Adeline Sugianto, Malabar (AU); Catherine Emily Chan, Randwick (AU); Lihui Song, Randwick (AU); Pei Hsuan Lu, Rockdale (AU); Alison Maree Wenham, Cronulla (AU); Ly Mai, Sefton (AU); Chee Mun Chong, Bellevue Hill (AU); GuangQi Xu, Randwick (AU); Matthew Edwards, Elanora Heights (AU)

(73) Assignee: NewSouth Innovations Pty Limited, UNSW Sydney, NSW (AU)

( * ) Notice: Subject to any disclaimer, the term of this patent is extended or adjusted under 35 U.S.C. 154(b) by 0 days.

(21) Appl. No.: 14/402,654

(22) PCT Filed: May 20, 2013

(86) PCT No.: PCT/AU2013/000528
§ 371 (c)(1),
(2) Date: Nov. 20, 2014

(87) PCT Pub. No.: WO2013/173867
PCT Pub. Date: Nov. 28, 2013

(65) Prior Publication Data
US 2015/0111333 A1 Apr. 23, 2015

(30) Foreign Application Priority Data

May 21, 2012 (AU) ................................ 2012902090

(51) Int. Cl.
*H01L 21/00* (2006.01)
*H01L 31/18* (2006.01)
*H01L 21/30* (2006.01)

(52) U.S. Cl.
CPC ........ *H01L 31/1868* (2013.01); *H01L 21/3003* (2013.01); *H01L 31/1804* (2013.01); *H01L 31/186* (2013.01); *H01L 31/1864* (2013.01); *Y02E 10/547* (2013.01)

(58) Field of Classification Search
CPC .............. H01L 21/3003; H01L 31/186; H01L 31/1864
See application file for complete search history.

(56) References Cited

U.S. PATENT DOCUMENTS

| 5,304,509 A | 4/1994 | Sopori | |
|---|---|---|---|
| 2015/0132881 A1* | 5/2015 | Wenham et al. | ................ 438/58 |

FOREIGN PATENT DOCUMENTS

FR 2 977 079 12/2012

OTHER PUBLICATIONS

Australian Patent Office, International Search Report and Written Opinion of the International Searching Authority, PCT/AU2013/000528, Jul. 30, 2013, 13 pages.

*Primary Examiner* — Reema Patel

(57) ABSTRACT

A method of hydrogenation of a silicon photovoltaic junction device is provided, the silicon photovoltaic junction device comprising p-type silicon semiconductor material and n-type silicon semiconductor material forming at least one p-n junction.

The method comprises:
i) ensuring that any silicon surface phosphorus diffused layers through which hydrogen must diffuse have peak doping concentrations of $1\times10^{20}$ atoms/cm$^3$ or less and silicon surface boron diffused layers through which hydrogen must diffuse have peak doping concentrations of $1\times10^{19}$ atoms/cm$^3$ or less;
ii) Providing one or more hydrogen sources accessible by each surface of the device; and
iii) Heating the device, or a local region of the device to at least 40° C. while simultaneously illuminating at least some and/or advantageously all of the device with at least one light source whereby the cumulative power of all the incident photons with sufficient energy to generate electron hole pairs within the silicon (in other words photons with energy levels above the bandgap of silicon of 1.12 eV) is at least 20 mW/cm$^2$.

21 Claims, 20 Drawing Sheets

ADVANCED HYDROGENATION OF SILICON SOLAR CELLS

The present invention relates generally to the manufacture of silicon solar cells and in particular the invention provides a new method of hydrogenation for silicon solar cells.

BACKGROUND

Hydrogenation of crystalline silicon involves the bonding of hydrogen atoms to crystallographic defects or contamination within the silicon lattice in a way that prevents that defect or contaminant from acting as a recombination site for minority carriers. This is known as passivation of the particular recombination site. This is important for semiconductor devices that require long minority carrier lifetimes such as solar cells and particularly where cheap silicon is used that often has poor crystallographic quality and/or purity and therefore needs passivation to bring the quality to acceptable levels for high efficiency solar cells.

Low cost silicon in general has much higher densities of silicon crystallographic defects and/or unwanted impurities. These lower the minority carrier lifetime of the silicon and therefore reduce the efficiencies of solar cells made from such material. Passivation of such defects and contaminants to improve minority carrier lifetimes is therefore an important part of being able to fabricate high efficiency solar cells when using lower quality silicon than that routinely used by the microelectronics industry such as with floatzone (FZ) wafers formed from semiconductor grade silicon.

Failure of Existing Commercial Solar Cells to Capitalise on the Potential of Hydrogen Passivation Currently, without a full understanding of the hydrogenation process and its potential, the designs of commercially manufactured solar cell structures are not ideal to facilitate hydrogenation throughout the cell, and this is reflected in the poor bulk lifetimes for technologies using standard commercial grade p-type wafers.

The ability of hydrogen to move throughout silicon is greatly inhibited by interactions with dopant atoms. For example, in equilibrium in n-type silicon, almost all hydrogen is in the negative charge state and in p-type silicon almost all hydrogen is in the positive charge state. However these states in the respective polarity of silicon can lead to the neutralization of dopant atoms, and can no longer move throughout the silicon. This behaviour of hydrogen in silicon has not been understood or has been overlooked in the past, with the result that attempts at hydrogenation have been less effective than would have been believed by cell designers.

For example, $H^+$ can interact with ionised boron atoms ($B^-$) to form neutral boron-hydrogen (BH) complexes. Similarly, $H^-$ can interact with ionised phosphorus atoms ($P^+$) to form neutral phosphorus-hydrogen (PH) complexes.

The dissociation of the dopant-hydrogen complexes is difficult, as even if there is sufficient thermal energy to dissociate the complex, the Coulombic attraction between the dopant atom and the atomic hydrogen ($H^-$ for phosphorus and $H^+$ for boron) prevents the escape of the hydrogen atom, and a rapid reformation of the dopant-hydrogen complex is likely.

It can now be seen that the main reasons for poor hydrogenation in the past include: heavy doping in emitters blocking hydrogen from penetrating deep within the silicon; absence of hydrogen sources from one or both surfaces; aluminium alloyed regions acting as sinks; failure to achieve the right charge state for the atoms of hydrogen to facilitate their bonding to certain types of defects and impurities; and no means of trapping of the hydrogen.

Conventional screen Printed Solar Cells dominate commercial manufacture however these have many features that limit the ability to hydrogenate the silicon properly. Firstly, there is a hydrogen source on only one side of the wafer. Since this hydrogen source is generally located at the front surface, in the form of a $SiO_xN_y$—$H_z$ or $SiN_x$—$H_y$ dielectric, the hydrogen being released into the silicon, struggles to make it deep into the bulk of the wafer due to the heavily doped region within the emitter.

Another limitation is due to the metal-silicon interfaces, which are largely unshielded and so act as sinks that remove the hydrogen ions. Once the hydrogen ions are within the sink region, sites such as di-hydride bonds annihilate the hydrogen ions, forming stable hydrogen molecules that cannot then bond with the silicon to passivate defects. This effect is particularly strong at the Aluminium contact at the rear surface, which is common to almost all commercially manufactured cells. During the firing of the contacts, the molten aluminium alloy is directly against the non-diffused silicon, thereby providing no means of blocking the hydrogen so that the molten region acts as a sink which removes much of the hydrogen.

The latest screen printed cells, which use a selective emitter, overcome some of these issues by using a predominantly lightly doped emitter that allows hydrogen to enter the bulk more easily and also has heavier doping under the metal that helps isolate the metal-silicon interface. However they still suffer from the limitations associated with the aluminium alloy and no rear hydrogen source, plus the peak doping in the emitter is still well above the preferred levels for allowing easy penetration of the hydrogen atoms. Furthermore, even if the concentration of hydrogen atoms reached suitable levels for good passivation of the silicon material, there is no attempt to either generate the preferred charge state for the hydrogen to enhance its bonding ability to certain defects or any attempt to prevent the reactivation of recombination sites during the cool-down that follows thermal processes above 400° C.

Similarly, Pluto cells which use technology having similar attributes to Laser Doped Selective Emitter (LDSE) technology have local heavy doping under the front contacts that help to isolate the hydrogen from the metal-silicon interface. Pluto cells also have a lightly doped emitter that makes it easier for hydrogen to penetrate from the dielectric hydrogen source on the front surface into the silicon wafer. However the surface concentration of phosphorous in Pluto cells is still too high to be optimal. Pluto cells also do not have a hydrogen source at the rear and suffer from the same issues with the rear contact and molten Aluminium alloy acting as a sink for the hydrogen. Furthermore, even if the concentration of hydrogen atoms reached suitable levels for good passivation of the silicon material, there is no attempt to either generate the preferred charge state for the hydrogen to enhance its bonding ability to certain defects or any attempt to prevent the reactivation of recombination sites during the cool-down that follows thermal processes above 400° C.

Sunpower's commercial cells, with a rear collecting junction, rely on using very high quality wafers that therefore achieve good performance without hydrogenation. However their cell structure and processing are not conducive to hydrogenation of the wafer in any case. Sunpower cells do not attempt to facilitate hydrogen penetration easily into either surface with surface oxide passivating layers acting to at least partially block the hydrogen. In addition, SunPower does not attempt to provide a rear surface hydrogen source, but even if there was one, most of the rear surface is heavily doped which would also prevent hydrogen from entering from a hydrogen source at the rear. In addition, the very high temperature processing on these cells is not conducive to retaining the hydrogen required for hydrogenation. Furthermore, even if the concentration of hydrogen atoms reached suitable levels for good passivation of the silicon material, there is no attempt to either generate the preferred charge state for the hydrogen to enhance its bonding ability to certain defects or any attempt to prevent the reactivation of recombination sites during the cool-down that follows thermal processes above 400° C.

Sanyo's Heterojunction with Intrinsic Thin layer (HIT) cell also uses a wafer with much higher minority carrier lifetime than the standard commercial p-type wafers. However, hydrogenation of the wafers would not be possible in any case since the HIT cell structure is based on having amorphous silicon on both surfaces of the cell; it is widely reported that the temperatures required for hydrogenation would seriously degrade the quality of the amorphous silicon and its passivation of the crystalline silicon surfaces.

Yingli's Panda cell is another commercial cell that is based on high quality n-type wafers that therefore achieve good performance without hydrogenation. But in any case, while little is known about the surface coatings of this new cell and whether it has suitable hydrogen sources in contact with the silicon at the surfaces, the cell has high doping at both surfaces (p+ at the front and n+ at the rear) that would block the hydrogen from getting into the silicon wafer anyway from either surface.

CSG Solar's thin film cell design is a commercial technology that could potentially have hydrogen sources on both surfaces, but the required crystallisation of the amorphous silicon is such a long and high temperature process that it drives out all the hydrogen from the source placed adjacent to the glass surface. This then results in the silicon nitride layer adjacent to the glass and the glass itself to act as sinks for any hydrogen that makes it through from the other side of the silicon. To add to this, the cell structure uses heavily doped surfaces on both the front and back that blocks most of the hydrogen entering the silicon, so most of it never reaches the silicon that needs to be passivated. Furthermore, even if the concentration of hydrogen atoms reached suitable levels for good passivation of the silicon material, there is no attempt to either generate the preferred charge state for the hydrogen to enhance its bonding ability to certain defects or any attempt to prevent the reactivation of recombination sites during the cool-down that follows thermal processes above 400° C.

SUMMARY

According to a first aspect, a method is provided for processing silicon, with a hydrogen source present, for use in the fabrication of a photovoltaic device having at least one rectifying junction, the method comprising heating at least a region of the device to at least 40° C. while simultaneously illuminating at least some of the device with at least one light source whereby the cumulative power of all the incident photons with sufficient energy to generate electron hole pairs within the silicon is at least 20 mW/cm$^2$.

According to second aspect, a method is provided for processing silicon for use in the fabrication of a photovoltaic device having at least one rectifying junction, the method comprising heating at least a region of the device to at least 100° C., followed by cooling the device while simultaneously illuminating at least some of the device with at least one light source whereby the cumulative power of all the incident photons with sufficient energy to generate electron hole pairs within the silicon is at least 20 mW/cm$^2$.

The silicon may comprise a device having at least one rectifying junction.

A method is provided for processing a silicon photovoltaic junction device comprising at least one rectifying junction, with a hydrogen source present, the method comprising heating at least a region of the device to at least 40° C. while simultaneously illuminating at least some and of the device with at least one light source whereby the cumulative power of all the incident photons with sufficient energy to generate electron hole pairs within the silicon (in other words photons with energy levels above the bandgap of silicon of 1.12 eV) is at least 20 mW/cm$^2$.

Photons generated by the at least one light source having sufficient energy to generate electron hole pairs in the silicon may comprise at least 70% of the total cumulative power of all photons incident on the device from the at least one light source.

The processing of the device may be a method of hydrogenation or another thermal process. The at least rectifying junction may comprise at least one p-n junction.

The heating of the device may comprise heating the device to at least 100° C. Alternatively the heating of the device may comprise heating the device to at least 140° C. Further, the heating of the device may comprise heating the device to at least 180° C.

The heating of the device may comprise heating all of the device and the illumination may comprise illuminating all of the device with at least one light source whereby the cumulative power of all the incident photons with sufficient energy to generate electron hole pairs within the silicon is at least 20 mW/cm$^2$ when processing a whole device, or processing may be performed locally on smaller regions of the device. Localised processing on small regions is particularly useful in the later stages of manufacture or after installation where this technique may be used to avoid thermally damaging sensitive structures.

For hydrogen sources external to the silicon, the method will be more effective when silicon surface n-type diffused layers through which hydrogen must diffuse have peak doping concentrations of 1×10$^{20}$ atoms/cm$^3$ or less. Similarly, the method will be more effective when any silicon surface diffused p-type layers through which hydrogen must diffuse have peak doping concentrations of 1×10$^{19}$ atoms/cm$^3$ or less.

Advantageously each surface of the device may be provided with access to one or more hydrogen sources during processing.

The hydrogen source or sources may be a hydrogen source contained within the device, such as hydrogen containing dielectric layers. Alternatively, the hydrogen source may be a hydrogen source located externally of the device.

Silicon surface n-type diffused layers through which hydrogen must diffuse may be phosphorus diffused layers. Silicon surface p-type diffused layers through which hydrogen must diffuse may be boron diffused layers or gallium diffused layers or aluminium diffused layers.

The illumination from the at least one light sources may be provided at levels whereby the cumulative power of all the incident photons with sufficient energy to generate electron hole pairs within the silicon is at least 50 mW/cm$^2$, or 60 mW/cm$^2$, or 70 mW/cm$^2$, or 80 mW/cm$^2$, or 90 mW/cm$^2$, or 100 mW/cm$^2$, or 150 mW/cm$^2$, 200 mW/cm$^2$, or 300 mW/cm$^2$, or 400 mW/cm$^2$, or 500 mW/cm$^2$, or 600 mW/cm$^2$, or 700 mW/cm$^2$, or 800 mW/cm$^2$, or 900 mW/cm$^2$, or 1000 mW/cm$^2$, or 1500 mW/cm$^2$, 2000 mW/cm$^2$, or 3000 mW/cm$^2$, or 5000 mW/cm$^2$, or 10000 mW/cm$^2$, or 15000 mW/cm$^2$, or 20000 mW/cm$^2$, or up to a light intensity at which the silicon begins to melt.

For each of the ranges of cumulative power mentioned above, the heating of the device may be provided to at least 200° C., or to at least 300° C., or to at least 400° C., or to at least 500° C., or to at least 600° C., or to at least 700° C., or to at least 800° C., or to at least 900° C., or to at least 1,000° C., or to at least 1,200° C. or to a temperature at which the silicon begins to melt. In general, for a given device, the lower the temperature, the higher the corresponding light intensity will need to be for optimal hydrogenation.

For each of the ranges of cumulative power and temperature mentioned above, the silicon surface phosphorus diffused layers may advantageously have peak doping concentrations of $1\times10^{19}$ atoms/cm$^3$ or less or $1\times10^{18}$ atoms/cm$^3$ or less or $1\times10^{17}$ atoms/cm$^3$ or less or $1\times10^{16}$ atoms/cm$^3$ or less and silicon surface boron, gallium or aluminium diffused layers have peak doping concentrations of $1\times10^{18}$ atoms/cm$^3$ or less or $1\times10^{17}$ atoms/cm$^3$ or less or $1\times10^{16}$ atoms/cm$^3$ or less.

For each of the ranges of cumulative power, and dopant concentration mentioned above, the processing method may be enhanced by heating the silicon photovoltaic junction device to a temperature (less than 500° C., or 400° C., or 350° C., or 300° C., or 250° C., or 200° C., or 150° C., or 100° C., or 50° C.) while the silicon photovoltaic junction device is illuminated.

Advantageously the illumination may be continued while the temperature is reduced. However for localised processing the silicon may cool sufficiently quickly that extended illumination during cooling may not be required. Illumination during cooling may be maintained, or even varied (increased or decreased) during the cooling step, relative to the cumulative power of all the incident photons with sufficient energy to generate electron hole pairs within the silicon in the heating step, in order to maintain the quasi electron Fermi-level in the best range. The illumination may also be controllably varied during the cooling step to maintain the quasi electron Fermi-level in the best range as the temperature of the device varies. The illumination may be continued during the cooling step, while the temperature is reduced to below a predetermined threshold, for example until the device temperature falls below 100° C., or until the temperature is reduced back to ambient temperature.

Minority carrier concentrations may be controlled, through the use of light and heat, during a cool-down period after heating, and any post hydrogenation thermal processes, to maintain hydrogen charge states during cool-down to minimise reactivation of defects to which hydrogen has previously bound. The process performed on the device may be a post hydrogenation thermal process performed at temperatures greater than 200° C. After the processes performed at temperatures greater than 200° C. is performed, illumination of the device is continued during cooling.

Localised hydrogenation or other thermal processing may be performed on a s small region of a device, or a larger region in increments, by locally heating the device in the region to be hydrogenated or otherwise thermally processed in the presence of a light source.

The proposed process potentially enables the achievement of superior hydrogen passivation of defects and contaminants and at potentially significantly lower temperatures than achievable using conventional processes.

Localised hydrogenation or other thermal processing may be performed by locally heating the device in the presence of a light source. If a laser is used the laser can achieve both the heating and illumination functions simultaneously.

Hydrogen sources may include layers of suitable dielectric materials such as silicon nitride, silicon oxynitride, aluminium oxides or layers of amorphous silicon etc., which may optionally be deposited onto surface passivating layers such has silicon dioxide and aluminium oxide. Hydrogen sources may also comprise forming gas or plasma sources of atomic hydrogen.

Advantageously also the device will not have a hydrogen sink that can absorb hydrogen.

Where the device does include a hydrogen sink, the method may be enhanced by isolating the hydrogen diffused into the silicon device from the hydrogen sink. Hydrogen sinks may comprising a metal/silicon interface, a region of the silicon with excessive levels of contaminants or a region of the silicon with a doping impurity above the solid solubility level of the dopant in silicon.

Such isolation can be achieved via internal electric fields created within the silicon. Internal electrostatic fields may be created by creating an impurity and concentration profile of an appropriate impurity type or else by increasing the dopant concentration approaching the sink to control the hydrogen charge state in that region which may drastically reduce the mobility for hydrogen. In particular heavily doped regions ($>10^{19}$ atoms/cm$^3$) may be placed beneath the silicon/metal interface of contacts. However these isolation regions should not isolate the surface through which the hydrogen must diffuse from the bulk of the silicon to be hydrogenated. For a device formed on a p-type wafer, which has a metal silicon/interface for electrical connection to the p-type bulk of the device, the method may further comprise forming an boron doped region between the metal silicon/interface and the p-type bulk of the silicon device, the isolation region being doped at a concentration greater than $10^{19}$. Similarly for an n-type wafer which has a metal silicon/interface for electrical connection to the n-type bulk of the device, the method may further comprise forming an phosphorous doped region between the metal silicon/interface and the n-type bulk of the silicon device, the isolation region being doped at a concentration $10^{19}$.

The cell structure will advantageously be designed such that during and after processing the escape of hydrogen from the active (desired) area is inhibited. An electric field may also be applied to promote diffusion and/or drift of hydrogen toward regions to be hydrogenated. The electric field may be an electrostatic field created or enhanced by applying layers of dielectric material to a surface of the device. The electric field may also be an electrostatic field created or enhanced by charging a surface of the device with an electrostatic gun. The electric field may also be an externally applied electric field.

The silicon photovoltaic junction device may have a structure designed to minimise the escape of hydrogen from the active area after hydrogenation or other thermal processing, the method further comprising forming a doped barrier region having a doping concentration level greater than an adjacent hydrogenated region. A hydrogen source may also be formed at both surfaces of the silicon photovoltaic junction device.

The intensity of illumination applied to the device may be varied during the thermal processing and cooling. The intensity of illumination applied to the device may be increased, or decreased, during a cooling stage after the hydrogenation or other thermal processes. In particular the intensity of illumination applied to the device may be increased, or decreased, with decreasing temperature of the device.

During a hydrogenation process, or during a process performed at greater than 200° C. after a hydrogenation process and for during cooling after such a process, the source of illumination applied to the device may be an array of LEDs. The source of illumination applied to the device may also be one or more infra-red lamps. The illumination applied to the device may be pulsed. The intensity of illumination applied to the device may be controlled to maintain the Fermi level at a value of 0.10 to 0.22 ev above mid-gap.

BRIEF DESCRIPTION OF THE DRAWINGS

Embodiments of the hydrogenation process will now be described with reference to the accompanying drawings in which.

DETAILED DESCRIPTION

Figure 1:
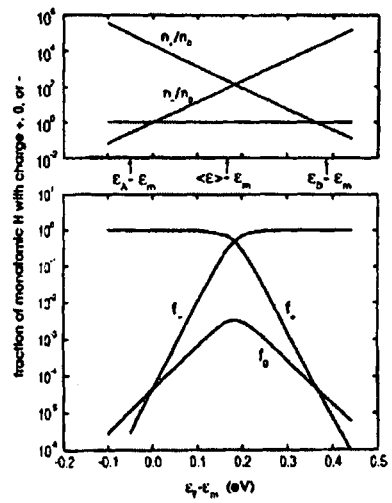
FIG. 1 graphically illustrates fractional concentrations of hydrogen charge states at low temperature (Herring, Johnson et al. 2001)

In particular examples of this method of hydrogenation, new techniques have been devised that greatly enhance the passivation of recombination sites within the silicon semiconductor material and at its surfaces, therefore greatly improving the material quality as indicated by the large increase in minority carrier lifetimes in comparison to those achieved through conventional hydrogenation techniques. The new approaches provide three innovative ways for use singly or together for improving the hydrogenation, by 1) through improved ability to get atoms of hydrogen into the silicon, 2) by improving the ability of the hydrogen within the silicon to then passivate recombination sites and 3) trapping the hydrogen within the semiconductor material in the right form to prevent damage to the passivation quality during the final stages of device processing such as through the cooling of the devices following thermal treatment:

1. Hydrogen penetration into the silicon material requires three sets of conditions to be simultaneously satisfied to be effective:

(i) It is advantageous to apply suitable hydrogen sources to both the silicon wafer surfaces or to layers already formed on the wafer surface with examples of such layers being PECVD deposited dielectrics such as silicon nitride, silicon oxynitride, amorphous silicon etc. which may optionally be deposited onto surface passivating layers such has silicon dioxide and aluminium oxide.

(ii) silicon surface n-type diffused or implanted layers such as doped with phosphorus will advantageously avoid peak doping concentrations above $1 \times 10^{20}$ atoms/cm$^3$ and more advantageously they will avoid being above $1 \times 10^{19}$ to avoid blocking the hydrogen atoms from penetrating into the silicon while p-type silicon surface diffused or implanted layers such as doped with boron will advantageously avoid peak doping concentrations above $1 \times 10^{19}$ atoms/cm$^3$ and more advantageously they will avoid being above $1 \times 10^{18}$ to avoid blocking the hydrogen atoms from penetrating into the silicon.

(iii) The atoms of hydrogen should also be in the right charge state to be able to penetrate well beyond the surface region and deep into the silicon wafer or layer. In general, if the wafer surface is p-type silicon, then the majority of hydrogen atoms are in their positive charge state and therefore blocked or strongly retarded by the fixed negative ions formed by the substitutional accepter atoms (or p-type dopants) that apply a strong coulombic force on the hydrogen atoms. However by generating increased amounts of hydrogen atoms in their neutral charge state ($H^0$), such atoms have relatively very high mobility and can travel easily into the silicon unaffected by any fixed charges within the silicon lattice. The concentrations of $H^0$ can be increased by increasing the concentrations of minority carriers (electrons in p-type silicon) which can in turn be done by avoiding high doping as explained above, using light to generate additional minority carriers (and increase their ratio compared to the majority carriers), use heat to thermally generate minority carriers (and further increase the mobility of the hydrogen atoms), use electrostatic effects through the addition of positive charge into the surface dielectric layer to raise the electron concentration in the surface of the p-type silicon layer and in general deliberately raise the injection level through combinations of these above effects to increase the $H^0$ fraction.

The equivalent applies to n-type surfaces except that the polarities are reversed such as the negative charge state for the hydrogen atoms dominates and these are retarded or blocked by the fixed positive ions formed in the silicon lattice by the n-type dopants. In this case, the hole concentration may be increased to lead to the generation of a higher fraction of $H^0$.

2. The effectiveness of the hydrogen atoms in passivating the recombination sites in the silicon may be greatly enhanced through having the hydrogen in the right charge state. In p-type silicon, under normal conditions, almost all the hydrogen atoms are in a positive charge state due to the absence of any electrons, resulting in the atom having a single positive unit of charge from the single proton in the atom's nucleus. This creates two problems which make it difficult for such an atom to be effective at passivating recombination sites in the silicon:

(i) the valency 3 atoms that give the silicon its p-type properties through creating positively charged holes, each lead to a fixed negative charge where each of the valency 3 atoms substitutionally replaces one of the silicon atoms. When the hydrogen atoms are in their positive charge state, they are strongly attracted to such fixed negative ions within the lattice, making it very difficult for such hydrogen atoms to get past such fixed negative ions. This makes it much more difficult for the hydrogen atoms to get to the locations of defects and contaminants that need passivating.

(ii) Even if the hydrogen atom is able to get to the location needing passivation, the chemistry involved in passivating many crystallographic defects and contaminants with a hydrogen atom requires the presence of an electron for the bonding process. When hydrogen atoms are in p-type silicon and in their positive charge state, such electrons are not available for the bonding process, making passivation very difficult.

By increasing the minority carrier concentration (the electrons) within the p-type silicon, it is possible to greatly increase the concentration of hydrogen atoms in their neutral charge state. This can be achieved somewhat by heating the silicon wafer, but is far more effective when the wafer is simultaneously illuminated with bright light to generate many additional minority carriers. Without the bright light, the temperature needed to sufficiently increase the minority carrier concentrations is too great and causes damage to the device being fabricated. With the combination of heat and light, the minority carrier concentrations can be increased sufficiently to allow a large increase in the concentration of hydrogen atoms that have a single electron attached to the hydrogen atom nucleus, therefore giving neutral charge state. When in this charge state, the hydrogen is no longer impeded by the strong coulombic forces from the fixed negative ions in the lattice that drastically reduce its mobility and it is also able to be more effective at bonding to recombination sites though the presence of the electron.

Conventional hydrogenation techniques using heat alone are far less effective than the proposed new techniques, with orders of magnitude increase in minority carrier lifetimes having been demonstrated in some cases with poor quality silicon when applying the proposed new techniques in comparison to conventional thermal approaches.

A consequence of the reduced importance of heating the wafers in the above hydrogenation techniques is that silicon wafers can now potentially be passivated at much lower temperatures, even room temperature. When in the neutral charge state, the mobility of hydrogen atoms within the silicon is sufficiently high to allow them to penetrate deep into the silicon even at room temperature. In this more reactive neutral charge state the hydrogen is then also able to passivate many of the recombination sites, even with minimal thermal energy. In comparison, in the literature, it is well documented that temperatures in the vicinity of 400° C. are necessary for effective passivation with hydrogen.

Further improvements can be made to the hydrogenation (passivation) process for the semiconductor material by ensuring not only that adequately high amounts of atomic hydrogen penetrate into the silicon, but also by avoiding sinks for the hydrogen that lead to its depletion. Sinks can occur in localised areas where the density and type of recombination sites trigger the formation of hydrogen molecules or other sites that will chemically react and bond to the atoms that therefore leave the hydrogen unavailable for passivation of other active recombination sites. Examples of sinks include metal/silicon interfaces or other regions of the silicon that depart excessively from the normal properties of crystalline silicon such as those with excessive levels of contaminants or even regions with doping impurities above their solid solubility levels. Such areas need to be either avoided or kept sufficiently small in area/volume or isolated from the regions being passivated by providing a barrier to retard or even prevent the atoms of hydrogen from getting to the sinks. Such barriers can be formed via internal electric fields created within the silicon through the appropriate choice of impurity type and concentration profile or else transforming the hydrogen charge state for hydrogen atoms approaching the sink. The latter can be done by increasing the dopant concentration to put hydrogen atoms in a charge state that drastically reduces their mobility. For example, for the former in p-type silicon, hydrogen atoms in the positive charge state will be blocked by the electric field from travelling from more highly p-type doped to more lightly p-type doped regions. Such a doping gradient can therefore be used to prevent the hydrogen atoms from reaching a region of high recombination such as a silicon surface or metal/silicon interface. An example of the latter is to shield the high recombination regions by the use of a heavily p-type or n-type doped layer. In a heavily p-type doped layer, the hydrogen is virtually all forced into the positive charge state with poor mobility as described earlier due to the fixed negative charges from the p-type dopants. In a heavily n-type doped layer, the hydrogen is virtually all forced into the negative charge state, also with poor mobility due to the fixed positive charges from the n-type dopants. Such heavily doped regions can therefore be used to block the hydrogen atoms from reaching high recombination regions by transforming their charge state in a way that causes the hydrogen to have very poor mobility as it is blocked by the fixed charges residing in such a region. This can be done by locating such heavily doped regions between the regions being hydrogenated and the hydrogen sinks formed from recombination sites. Examples include placing heavily doped regions directly beneath metal contacts or in localised areas where the surface recombination velocity is high or along grain-boundaries. In all such examples, the heavily doped regions block hydrogen atoms from the wafer from reaching the recombination sites that would otherwise act as sinks.

3. In thermal processes following the passivation of recombination sites, the benefits of hydrogen passivation may be reversed and the effect reduced or possibly lost entirely if precautions are not taken. It is common for the thermal energy to cause the hydrogen atoms to be released so as to reactivate the recombination sites. This even happens during the cool-down of the silicon wafer following the hydrogenation process. The latter is contributed to significantly by the released hydrogen atom changing charge state following its release so that it is no longer able to repassivate the reactivated recombination site. For example, if a p-type wafer has been hydrogenated using a combination of thermal and light energy as described earlier, the high minority carrier concentration ensures adequate levels of the hydrogen atoms are in the neutral charge state or negative charge state to allow recombination sites to be bonded to and therefore passivated. However the passivation process is a two-way process whereby recombination sites are repeatedly passivated and then reactivated and then repassivated and this continues provided the thermal energy remains and minority carrier concentrations remain sufficiently high to retain the hydrogen in the necessary charge state. In conventional hydrogenation processes for p-type silicon wafers, during the cool-down at the completion of the process, the minority carrier concentration falls significantly leading to a large reduction in the amount and percentage of hydrogen atoms in the neutral charge state, with virtually all adopting the positive charge state rendering them incapable of repassivating many of the recombination sites. Consequently, the quality of hydrogen passivation deteriorates significantly during the cool-down process, with similar forms of deterioration also often occurring during thermal processes subsequent to the hydrogenation process.

In embodiments of the present process, the deterioration in passivation quality during cool-down and subsequent thermal processes may be avoided by maintaining much higher minority carrier concentrations in the p-type material during such cool-down regimes and subsequent processes through the use of bright light to generate additional minority carrier concentrations. In fact during cool-down it can be beneficial to actually increase the light intensity to compensate for the reduction in minority carrier concentrations that would normally accompany reduced thermal generation of electron/hole pairs. The higher minority carrier concentrations help maintain higher concentrations of the hydrogen atoms in their neutral charge state and therefore able to repassivate recombination sites that are reactivated when hydrogen is lost.

Application of the strategies proposed herein to lower quality silicon wafers formed from low cost UMG silicon, have been shown to improve minority carrier lifetimes by more than two orders of magnitude (more than 100 times increase). Even standard commercial grade p-type CZ wafers have their minority carrier lifetimes increased by more than an order of magnitude from typically 50 microseconds to approaching 1 ms following the application of the passivation techniques proposed herein. Conventional hydrogenation techniques appear incapable of increasing minority carrier lifetimes by more than a factor of two regardless of the starting quality of the crystalline silicon wafer or layer.

In general, conventional hydrogenation processes are applied to the whole wafer by applying the thermal process to the whole wafer so that it is uniform in temperature. However the proposed processes can also be applied locally through the use of a localised heat source and light source such as a laser. This allows the majority of the wafer to be held at a substantially different temperature such as room temperature while the localised region being hydrogenated can be raised to a much higher temperature while simultaneously being illuminated by high light intensity to locally raise the minority carrier concentrations to effect the localised hydrogen passivation. Localised heating also allows rapid cooling as the volume heated will be a small percentage of the volume of the total device and the device acts as a heat sink to quickly cool the locally heated region when the heat source is removed. In these circumstances the charge carrier pairs take a finite time to recombine after removal of the light source, and so the charge state of the hydrogen is also maintained for a finite time, and the light source may be removed before the region being treated is fully cooled. Such localised hydrogenation can be particularly useful when localised regions of damage or high recombination exist that can not to be passivated without affecting the remainder of the wafer. This can avoid depletion of the hydrogen sources in non-illuminated areas or avoid damaging the passivation in non-illuminated regions while passivating the illuminated regions. It also provides a mechanism for hydrogenating finished devices or even encapsulated devices where the wafer cannot be uniformly heated. It also provides a mechanism for avoiding hydrogen atoms from passivating the metal/silicon interfaces that can seriously damage the ohmic contact by raising the effective contact resistance.

Charge State Importance for Defect Passivation and Corresponding Importance of Temperature and Illumination for Hydrogenation It has been determined that there exist defects in silicon that cannot be passivated by positively charged hydrogen ions ($H^+$) which is the dominant species (fraction of total interstitial hydrogen ~=1) in p-type materials. In order to reach bulk lifetimes in the order of hundreds of microseconds on defected (not-float zone) silicon wafers it is necessary to passivate these defects. This can be achieved using the "minority" charge states of hydrogen, the neutral $H^0$ and the negatively charged $H^-$. Means of increasing the concentration/generation of minority charge states of hydrogen are outlined herein. The proposed means of increasing the concentration/generation of these minority hydrogen species is performed in such a manner as to effectively passivate these defects and to ensure that they remain passivated, realising bulk lifetime improvements far in excess of what is currently achievable without these species.

The minority charge states have two important properties that allow them to effectively passivate defects throughout the material. The first is their increased reactivity due to the electrons they possess which allow them to participate in more passivation reactions. The second is their altered mobility in silicon. $H^0$ is unaffected by electric fields and electrostatic effects creating coulombic forces on charged species which can be very effective at blocking charged hydrogen and hence at even moderate doping concentrations of $1\times10^{16}$ dopant atoms/cm3 and as low as $1\times10^{15}$ dopant atoms/cm3 for boron dopants, is likely to have a greater mobility than the charged species, especially at lower temperature. In n-type silicon, $H^-$ is actually less mobile than $H^+$ and needs careful manipulation for it to be released from an n-type region due to the electric fields present. $H^-$ does have one important difference to $H^0$ which offsets this somewhat, which is its increased stability in p-type silicon. In p-type material, $H^0$ recombines with a hole very readily to form $H^+$ such that at all conditions the equilibrium concentration is much smaller ($<10^{-2}$) than the concentration of the charged species. Whereas $H^-$ needs to decay to $H^0$ before being converted to $H^+$, which it does with an activation energy of ~0.7 eV. This leads to $H^-$ having greater stability and lifetime than $H^0$ within p-type silicon, but with the former being more challenging to generate within or penetrate into p-type silicon. The use of electrostatic effects such as through externally applied electric fields or the use of electrostatic charge within surface dielectric layers and/or pulsed light and heat sources can be used to create the conditions necessary for forming more $H^0$ and/or $H^-$, but with the pulse of light or heat source or pulse of externally applied electric field then ending so as to return the silicon to its original p-type state but with the presence of additional $H^0$ and/or $H^-$ hydrogen atoms.

The determining factor for the equilibrium concentrations and generation rates of the various charge states of hydrogen in silicon is the carrier concentrations and the carrier quasi Fermi levels. The reactions of interest are:

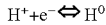

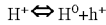

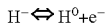

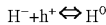  (0-1)

As may be seen if the hole concentration is much higher than the electron concentration then the $H^+$ will dominate. Herring and Johnson (2001) put forward a model to predict the equilibrium ratios of the various charge states (in the case of thermal equilibrium so only one Fermi level), $$\frac{H^+}{H^0} = \frac{v_+ Z_+}{v_0 Z_0} \exp\left(\frac{\varepsilon_A - \varepsilon_F}{kT}\right)$$

$$\frac{H^-}{H^0} = \frac{v_- Z_-}{v_0 Z_0} \exp\left(\frac{\varepsilon_F - \varepsilon_D}{kT}\right)$$  (0-2)

Where v is the number of equivalent configurations for each species and Z is the corresponding partition function. It is generally accepted that the donor level is close to the conduction band edge (Herring and Johnson 2001 ~0.4 eV above mid-gap) and the acceptor level is close to mid-gap (Herring and Johnson ~0.07 eV below mid-gap.). This asymmetry in energy levels means that $H^+$ dominates in even lightly doped n-type silicon.

FIG. 1 illustrates fractional concentrations of hydrogen charge states at low temperature (Herring, Johnson et al. 2001). Under non-equilibrium conditions where we have quasi-fermi energies, the relation between $H^+$ and $H^0$ depends primarily upon the electron quasi Fermi energy, with the hole quasi Fermi energy having little impact. The reasons for this are twofold, the first being that the first reaction in (0-1) above proceeds much more rapidly than the other equations while the second is that since the hole quasi-fermi energy is for most conditions below mid-gap the difference between the hole quasi Fermi energy and the hydrogen acceptor level is always large in comparison to the difference between the other energy levels.

Figure 2:
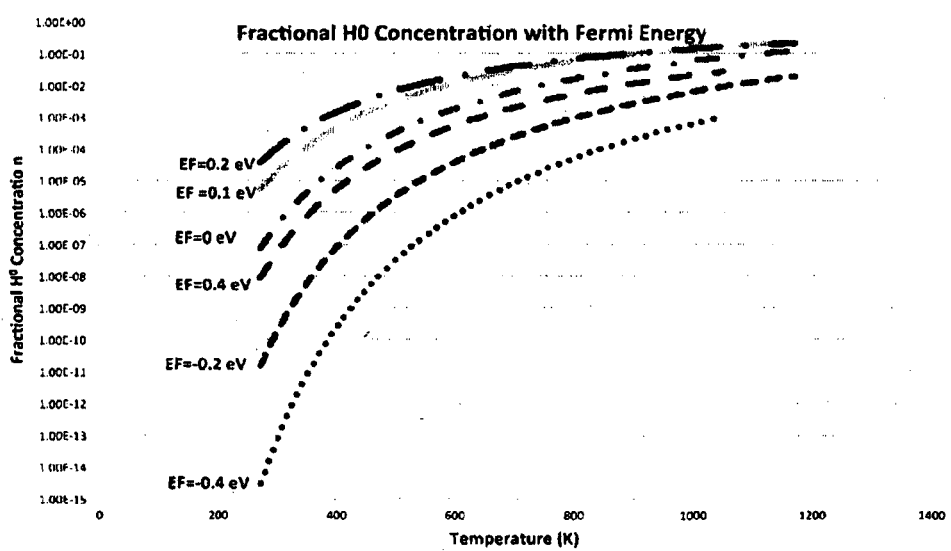
FIG. 2 graphically illustrates $H^0$ concentration as a function of Electron Quasi Fermi Energy and Temperature.

FIG. 2 shows the expected fractional $H^0$ concentration (based on a simplistic model) as a function of electron quasi fermi level and temperature.

Note that it is not only the equilibrium concentration which should be considered. The $H^0$ should be generated close to the defects which are to be passivated so that it does not relinquish its electron (recombine) while travelling to the defect. The generation appears to depend upon the minority carrier concentration (and not upon the carrier concentration ratio). Therefore in a region with a high minority carrier concentration the rate of passivation of defects by $H^0$ may be significantly higher than the equilibrium concentration would suggest.

Manipulation of Charge States: Temperature and Illumination

The primary means of controlling charge states of hydrogen is by controlling the concentration of charge carriers. The primary approach in p-type silicon will be to increase the minority (electron) charge carrier concentration. An alternate approach is to reduce the majority charge carrier concentration (as a consequence the minority carrier concentration is likely to increase anyway). The proposed means of performing this are by:

i) Temperature

Very effective method of increasing minority carrier concentration is through thermally generated carriers. Several papers have investigated temperatures required for annealing and have concluded that the anneal needs to be high temperature to allow the hydrogen to diffuse through the bulk. We would contend that the main benefit of the high temperatures is to increase the minority carrier concentration thus increasing $H^0$ equilibrium concentration and generation. This may in turn increase diffusivity as the hydrogen can diffuse as $H^0$.

One of the main effects of temperature is an increase in the concentration of thermally excited carriers, represented by an increase in the intrinsic carrier concentration $n_i$, where the concentration of electrons and holes is given by $np=n_i^2$. At low injection we can still consider that majority carrier concentration is equal to dopant concentration, therefore as $n_i$ increases the minority carrier concentration increases proportionally, until we move towards high injection where the minority carrier concentration approaches the majority carrier concentration. Therefore with increasing temperature the ratio of carrier concentrations decreases and the Fermi energy moves towards mid-gap. However this is somewhat compensated for by the increase in the temperature term relating the $H^0:H^+$ and $H^0:H^-$ ratios, therefore if the Fermi level remains constant then the $H^0$ concentration increases with temperature. This may in part explain the results of others who claim that the best hydrogenation is carried out at temperatures greater than 700° C. It is important to note that such high temperatures have the potential to cause significant damage such as through loss of hydrogen from the device, damage to metal/silicon interfaces, damage to the silicon material etc. In fact trapping of $H^0$ at these temperatures is likely impossible and that any significant passivation of recombination sites at such temperatures will likely be lost during cool-down as the minority carrier concentrations reduce leading to unfavourable hydrogen charge states but while sufficient thermal energy still remains to release the hydrogen atoms from their recombination sites that they were passivating.

Another effect of temperature relevant to hydrogenation is the release of hydrogen from dielectric films. Currently the most commonly used hydrogen sources are dielectric films on the surfaces of wafers which release hydrogen under annealing, with the rate of hydrogen release dependent upon the anneal temperature.

As indicated, one drawback of using the temperature to control the hydrogenation process is the need to return the structure to room temperature, losing control of the temperature in the cool-down period. However loss of passivation occurs during this process can in fact be minimised through the combined control of the cooling rate and carrier concentrations with the latter still able to be controlled using illumination or electric fields.

ii) Illumination

Illumination can be used to generate charge carriers. Not only does this change the minority carrier concentration it moves the electron quasi fermi energy into the upper half of the bandgap under the right conditions. This increases the equilibrium $H^0$ concentration.

Control of illumination independent of temperature is important for many applications in hydrogenation, most particularly during cool-down of the wafer. To achieve this the illumination wavelength becomes an important parameter. If illuminated with long wavelength light (1000 nm) the number of photons per watt is ~$5\times10^{18}$, while at 500 nm it will be $2.5\times10^{18}$. In order to achieve 10 suns we require a flux of 1 W per cm² with AM1.5, but with 1000 nm light, only about half that is required, therefore contributing far less to the heating of the wafer. How much this changes the wafer temperature will depend on the heat transport mechanisms but a heat sink would in some cases be desirable for cooling.

Figure 3A:
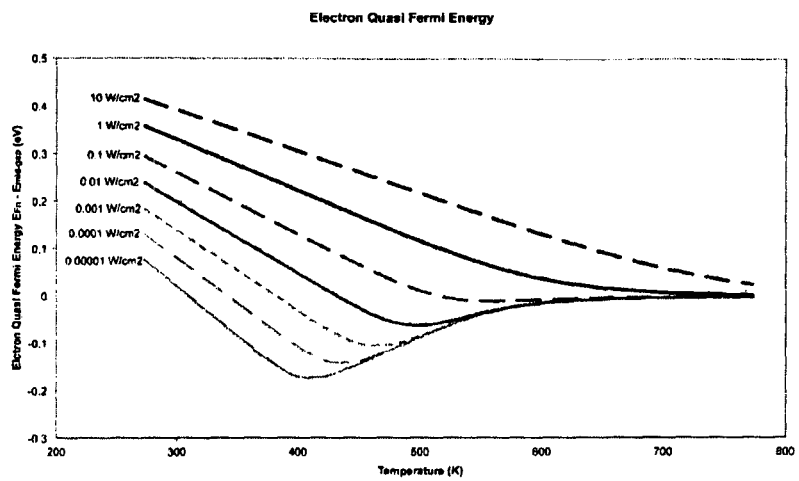
FIG. 3 graphically illustrates the electron quasi Fermi level as a function of heat and illumination intensity (AM 1.5 spectrum) for wafers of various bulk doping concentrations.
Figure 3B:
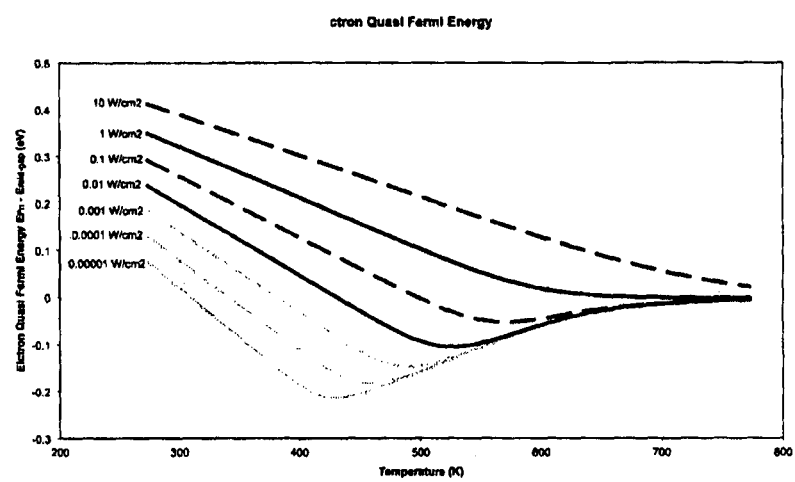
Figure 3C:
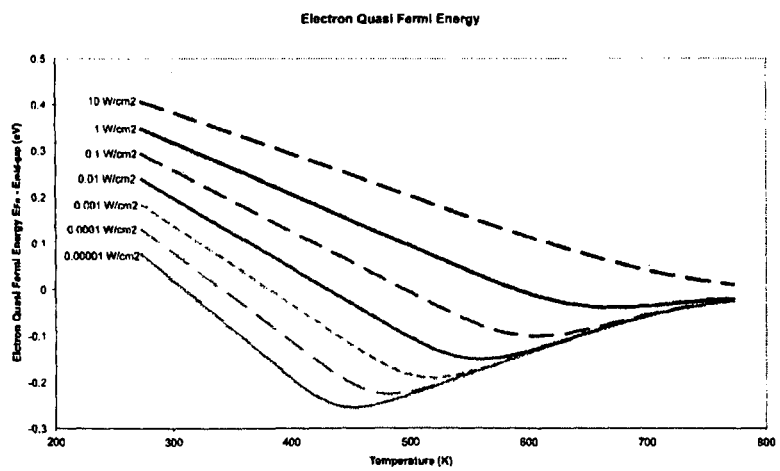

FIG. 3 shows the electron quasi Fermi level as a function of heat and illumination intensity (AM 1.5 spectrum) for wafers of various bulk doping concentrations. Under bright illumination their behaviour does not differ much however when there is very little illumination then the more heavily doped wafers see the electron quasi-fermi energy dip further below mid-gap and just as importantly stay below mid-gap at higher temperatures where re-activation of passivated defects is more likely.

Industry State of the Art

Current Industry Implementation typically consists of hydrogenation from a silicon nitride film. The hydrogenation process is usually carried out during the metal firing process and consists of a high temperature (700-900), short duration (typically a matter of seconds) anneal (using a belt furnace) followed by a cool-down to room temperature. Hydrogen is introduced into the cell from the silicon nitride but, owing to the molten aluminium silicon alloy at the rear of the cell, hydrogen escapes readily from the rear surface.

Furthermore while the heating elements in the belt furnace may produce some light, the cooling process is carried out in the dark so the $H^0$ concentration drops off rapidly. Light emitted in the belt furnace during heating is not intentional and is inadequate to optimally illuminate the device to enhance hydrogenation.

Below is a quick analysis of some current implementations in industry and how they could be improved.

Screen Printed Solar Cell

Figure 4:
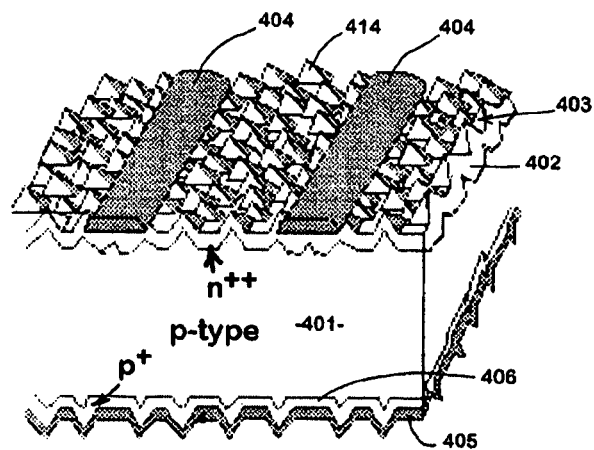
FIG. 4 diagrammatically illustrates a screen printed solar cell.

The Screen Printed Solar Cell is presently the dominant silicon photovoltaic technology. The typical structure of the screen printed solar cell is illustrated in FIG. 4 and comprises a p-type substrate 401 having a textured front surface 414 with a heavily doped $n^{++}$ front surface emitter 402, a silicon nitride layer 403, over the emitter 402 which acts as a hydrogen source during hydrogenation, and screen printed front metal contacts 404 which contact the emitter 402 through the nitride layer 403. On the rear surface the screen printed aluminium rear contact 405 contacts the p-type substrate 401 via an aluminium alloyed rear surface 406 formed by alloying the screen printed aluminium contact 405 with the substrate 401 when the rear contact 405 is sintered. This provides a $p^+$ region between the aluminium contact 405 and the p-type silicon of the substrate 401.

As mentioned above, hydrogenation is carried out with co-firing of the screen printed rear metal contacts 405 at high temperatures. A further limitation of screen printed cells is their homogeneous, heavily doped emitters 402 which effectively block the introduction of hydrogen sourced by the silicon nitride layer 403 into the wafer.

Simple Improvements can be achieved by i) creation of a heavily doped layer to screen the rear alloyed region 406. This can be done separately to the aluminium alloying process or by adding dopant impurities in small amounts into the aluminium paste which is used to screen printed the rear metal contact 405 and then firing the paste whereby the first to solidify material with the additional dopants is then used to block the hydrogen atoms from reaching the remaining molten silicon region therefore facilitating improved hydrogen passivation. This effect can be enhanced by multiple firing of the paste whereby the subsequent firing is at lower peak temperature so as not to destroy (remelt) the thin impurity doped layer formed to block the hydrogen. Alternatively, equivalent can be achieved in a single firing process whereby slight cooling from the peak temperature allows the deliberately added dopants to form a solid layer that blocks the hydrogen, with the device then held at this somewhat reduced temperature to allow more hydrogenation to take place before further cooling.

ii) Controlled illumination during cooling after hydrogenation.

iii) Use of a lower peak doping concentration in the emitter 402 to avoid blocking so much of the hydrogen, which requires a trade-off with emitter sheet resistance and contact resistance.

LDSE/Pluto

Figure 5:
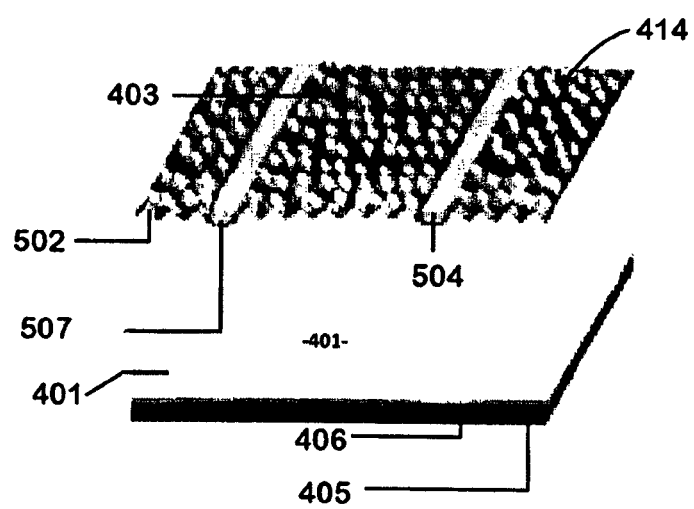
FIG. 5 diagrammatically illustrates a LDSE solar cell.

Referring to FIG. 5, the LDSE/Pluto cell comprises a p-type substrate 401 having a textured front surface 414, a lightly doped front surface emitter 502, a silicon nitride layer 503, which acts as a hydrogen source, self-aligned metal contacts 504 over heavily doped $n^{++}$ semiconductor regions 507. The rear of the cell is similar to the screen printed solar cell described above, having a screen printed rear contact 405 separated from the substrate 401 by an aluminium/silicon alloyed layer 406. While the selective emitter approach of this technology allows improved access for hydrogen, it would still be advantageous to reduce the peak phosphorus doping level to $1\times10^{20}$ atoms/cm3 or less, plus the aluminium alloyed region 406 at the rear surface is still a hydrogen sink. The front contacts 504 are well protected from the hydrogen by the heavily doped region 507 while the hydrogen can access the bulk of the cell through the lightly doped emitter regions 502. In this cell type, hydrogenation is still carried out concurrently with co-firing of rear screen printed aluminium contact 505 at high temperatures and therefore the above strategy of adding dopants to the aluminium paste still applies.

Simple Improvements can therefore be achieved by:

i) creation of a heavily doped layer to screen the rear alloyed region, using a small amount of dopant impurities in the aluminium paste as with the screen printed solar cell described above.

ii) reducing the peak phosphorus doping concentration in the non-metallised regions;

iii) controlled illumination and potentially increasing illumination during cooling after hydrogenation.

Schmidt Selective Emitter

Schmidt selective emitter is similar to the LDSE/Pluto cell described above with reference to FIG. 5, however the doped region 507 under the metal emitter contacts 504 is not as heavily doped as in the LDSE/Pluto cell implementation so there is less effective blocking of hydrogen from the metal contacts.

Sunpower

Figure 6:
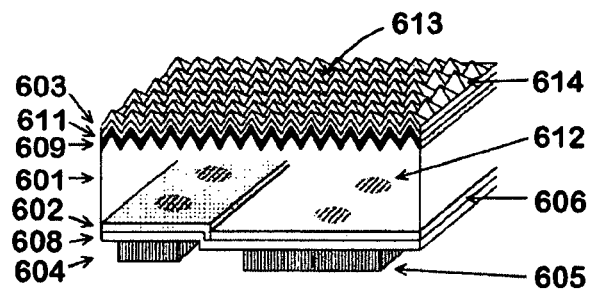
FIG. 6 diagrammatically illustrates a Sunpower rear contact cell.

Referring to FIG. 6, the Sunpower device comprises an n-type substrate 601 having a textured surface 614 with an $n^+$ front surface field 609, a silicon dioxide front surface passivation layer 611 and a front surface antireflection coating 613. A p+ diffusion region 606 on part of the rear surface forms a junction and metal contacts 605 contact the $p^+$ diffusion region 606 through a silicon dioxide passivation layer 608. Contact to the n-type substrate 601 is via an $n^+$ diffusion region 602 interleaved with the $p^+$ diffusion region 606. Metal contacts 604 also connect to the $n^+$ diffusion region 602 through the silicon dioxide passivation layer 608.

The Sunpower device has no dedicated hydrogenation layer or process for the rear surface as the substrates used are already high quality and high lifetime (and hence expensive) n-type crystalline substrate 601.

Simple Improvements can be achieved by:

i) adding a rear hydrogen source and reducing the peak doping for much of the rear surface so as not to block the hydrogen;

ii) applying appropriate hydrogenation which would remove the need for high purity substrate, however the high temperature processing used in this cell design would be incompatible with many hydrogen sources.

Semiconductor Fingers

Devices using semiconductor fingers are similar to the Schmidt selective emitter, unless laser doping is used to form the fingers, in which case these devices are similar to LDSE devices.

HIT Cell

Figure 7:
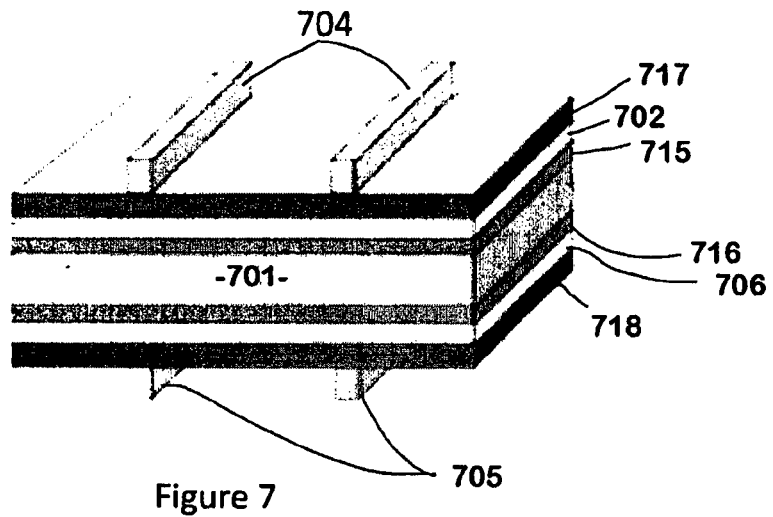
FIG. 7 diagrammatically illustrates a HIT Cell.

The HIT device illustrated in FIG. 7 comprises a high quality Czochralski (CZ) process crystalline substrate 701 having intrinsic amorphous silicon layers 715, 716, on each surface. An n-type amorphous silicon layer 706 and a transparent conductive oxide layer 718 are formed over one of the intrinsic amorphous silicon layers 716, while a p-type amorphous silicon layer 702 and a transparent conductive oxide layer 717 is formed over on the other intrinsic amorphous silicon layer 715. Metal grid electrodes 705 for the n-type amorphous silicon layer 706 are formed over the TCO 718 while metal grid electrodes 705 for the p-type amorphous silicon layer 702 are formed over the TCO 717.

Although the HIT structure is potentially good for effective hydrogenation, the use of amorphous silicon layers 702, 706, 715, 716 limits the temperatures that the structure can tolerate without degradation to an upper limit of approximately 250° C., which is too low for conventional hydrogenation. As with Sunpower design the silicon wafer 701 used in the HIT cell is high quality and high lifetime.

Simple Improvements can be achieved by:

i) Performing hydrogenation at low temperature such as through using bright light to generate carriers and the preferred hydrogen charge state, in which case a lower quality and lower cost substrate could be used.

APPLICATION EXAMPLES

Figure 8:
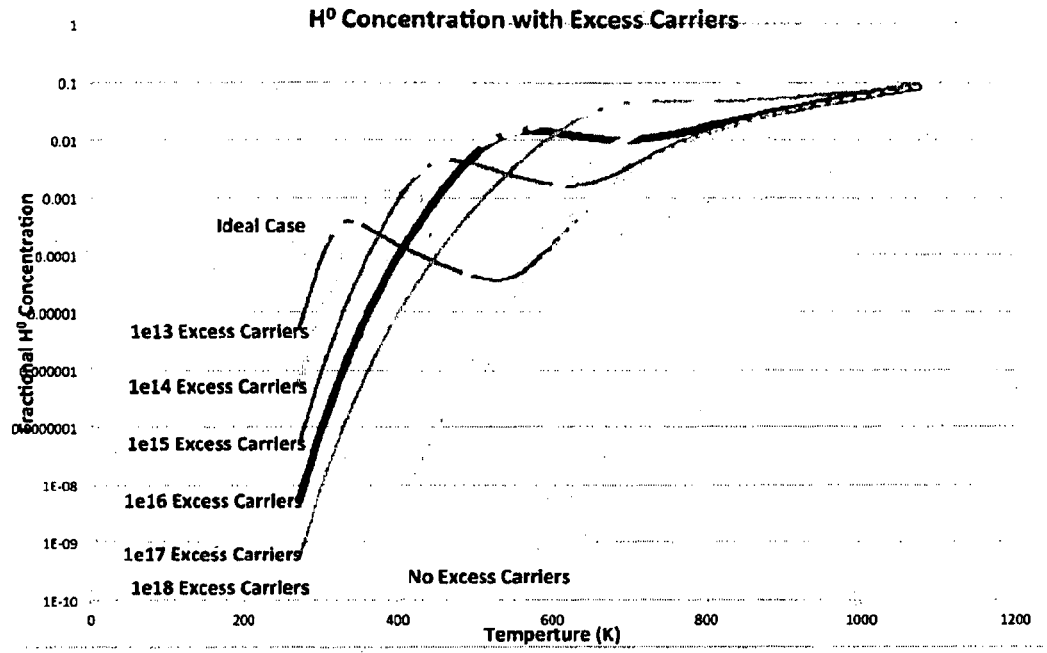
FIG. 8 graphically illustrates fractional $H^0$ concentration as a function of excess carrier concentration due to illumination.
Figure 9:
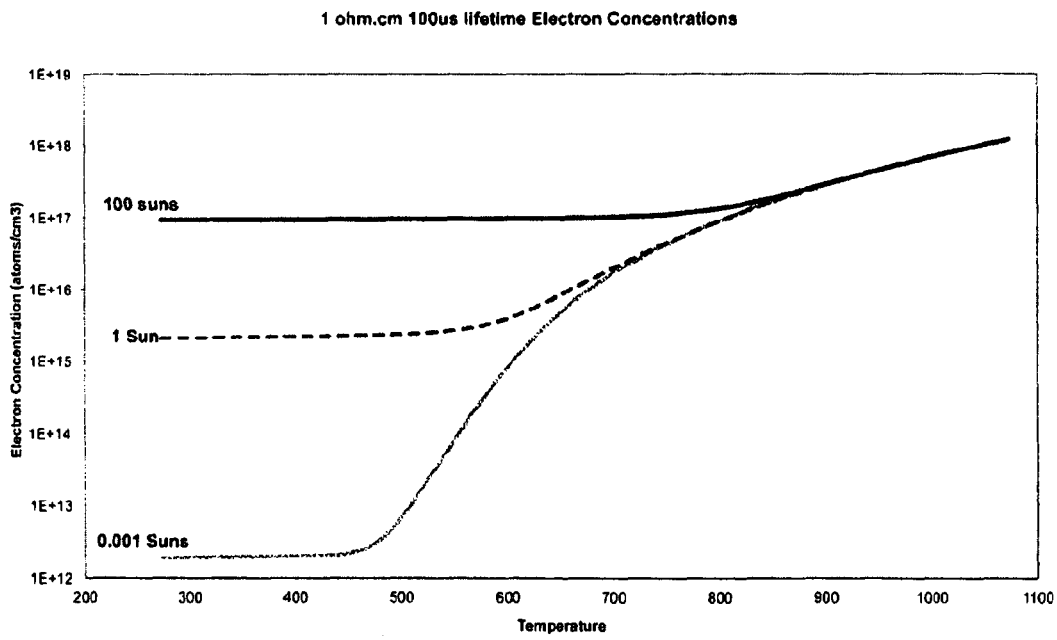
FIG. 9 graphically illustrates fractional $H^0$ concentration and Electron Quasi Fermi Energy with low temperature hydrogenation paths for $1 \times 10^{16}$ bulk doping.
Figure 10:
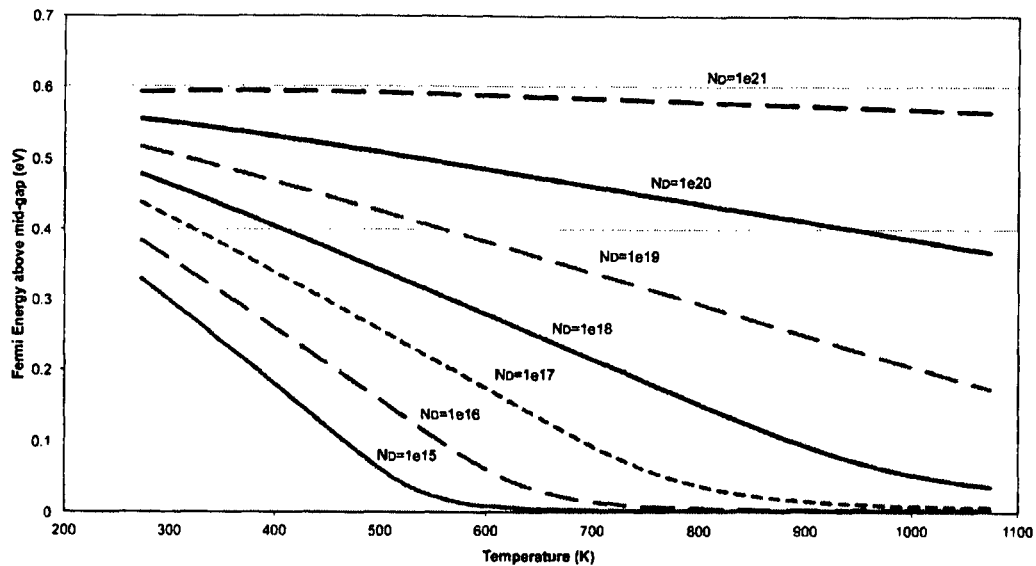
FIG. 10 graphically illustrates Fermi energies in n-type silicon (no illumination) as a function of doping concentration and temperature.

FIGS. 8, 9 & 10 graphically illustrate respectively fractional $H^0$ concentration as a function of temperature and illumination for bulk p-type doping of $1.5\times10^{16}$ with hydrogenation paths for material with a minority carrier lifetime of 100 microseconds; fractional $H^0$ concentration and Electron Quasi Fermi Energy with low temperature hydrogenation paths for $1\times10^{16}$ bulk doping doping with a minority carrier lifetime of 100 microseconds; and Fermi energies in n-type silicon (no illumination) as a function of doping concentration and temperature;

Post Anneal Cooling

At present hydrogen passivation is predominantly at 400° C. or carried out at relatively high temperatures (700° C. to 900° C.) when carried out in conjunction with metal firing processes. At these latter high temperatures, as long as the wafer is only lightly doped, the Fermi energy is nearly mid-bandgap for bulk material and the emitter Fermi energy is approaching 0.2 eV above midgap, so hydrogen may exist as $H^0$ and hence escape the emitter region more easily.

The problem with hydrogenation at these temperatures is to avoid driving too much hydrogen out of the device, the inability to achieve the preferred charge state for hydrogen passivation in more heavily doped regions and the need to bring the wafers back down to room temperature. During cooling passivated defects may re-activate and, since the Fermi level will have moved away from mid-badgap even in the lightly doped bulk, there is a greatly reduced level of generation/equilibrium concentration of the minority charge species of hydrogen to re-passivate them, which means that the concentration of unpassivated impurities will increase and the wafer lifetime will decrease.

To prevent this, the samples may be cooled under illumination, such that the minority carrier concentration is maintained at a high level until temperatures are reached below which the hydrogen passivation of the defects are thermally stable. It may even be more advantageous to increase the illumination level as the wafers cool to keep the minority carrier concentrations more uniform. It is also advantageous to use a light source that maximises the number of minority carriers generated for a given amount of wafer heating so as not to interfere with the wafer cooling. This means minimising the number of photons below the bandgap of silicon and preferably maximising the number with energy levels just above the bandgap of silicon which can still be absorbed in the silicon. Note that the bandgap of the silicon changes during the cool-down process.

Example 1

Standard High Temperature Hydrogenation Anneal with Constant Illumination During Cool Down This method would consist of a high temperature anneal (~700° C.) followed by a cool down with a constant illumination level sufficient to maintain the electron quasi Fermi energy above mid-gap at all times until the wafer has cooled enough for the next process. This may be carried out with any cooling rate, and one possible implementation would comprise incorporation of lights into the cooling region of an inline belt furnace.

Example 2

Standard High Temperature Hydrogenation with Illumination Controlled Over Process As above, the wafers would first be hydrogenated at high temperatures for a brief period with as much illumination as possible (up to a limit of several hundred suns). As the wafers cool the light intensity will also decrease such that the electron quasi-fermi energy remains in the ideal region for $H^0$ generation (0.1-0.3 eV above mid bandgap). This may be achieved for example using a belt furnace where the light intensity is set to become weaker as the wafers progress through the cooling zone.

Example 3

Combined Heat and Light Source Controlling Both Parameters Over Process

In this process the heat and light for the process are provided by the one source, with a wavelength and ambient conditions chosen such that the carrier concentrations remain within the ideal region at all times. Such a source may be a lamp with controllable output and appropriately chosen output spectrum or a laser as discussed under localized hydrogenation.

Low Temperature Hydrogenation

Provided enough hydrogen can be released from the dielectric hydrogen source, very effective hydrogenation may be realised using a single source for both heat and light with the thermal conditions set such that the Electron Quasi Fermi Energy is between 0.15 and 0.25 eV above mid-gap throughout a hydrogenation process.

The concentration of H⁰ increases with temperature as long as the Fermi level can be maintained in this range. So for a set maximum illumination level the most effective hydrogenation is obtained by heating under maximum illumination to the point where this illumination moves the quasi fermi energy to the minimum of the range outlined above and then cooling under illumination such that the Fermi energy remains within this range.

The effectiveness of this process may well depend upon the maximum light intensity achievable, but with illumination of 10 suns, H⁰ concentrations equivalent to those achieved at 700° C. may be realised at 350° C., making it a lower temperature and hence more compatible process.

Example 4

Low Temperature Hydrogenation with Constant Illumination

In this example hydrogenation is carried out at low temperature (300-500° C.) with enough illumination to get the electron quasi-fermi energy to the desired level. The wafer would be allowed to cool under the same illumination and when the illumination and temperature is such that the H⁰ concentration is decreased, due to the prevalence of H⁻, the temperature is low enough for significant re-activation to be avoided.

Example 5

Low Temperature Hydrogenation with Illumination Controlled Over Process

As above however in this implementation the illumination would be decreased as the wafer cools so as to maintain the electron-quasi Fermi energy in the desired range.

Example 6

Combined Heat and Light Source Controlling Both Parameters Over Process

In this process the heat and light for the process are provided by the one source, with a wavelength and ambient conditions chosen such that the carrier concentrations remain within the ideal region at all times with temperature kept below 500° C.

Example 7

Use of Short Wavelength Light to Release Hydrogen

One possible drawback of using lower temperatures is that less hydrogen is released from dielectric layers at lower temperatures. Maintaining conditions throughout the wafer similar to those described above, a short wavelength (blue-UV) high intensity light source may be used to release hydrogen from the dielectric by applying localised heating at the very surface of the wafer to increase the release of hydrogen from the dielectric.

Localized Hydrogenation

Example 8

Use of Laser for Localized Hydrogenation

Lasers are capable of providing both the heat and light needed for effective hydrogenation over a small area, by passing an appropriately chosen laser (controlled wavelength and power intensity) over a surface, a small area of the wafer may be heated to a desired temperature under illumination which will allow for effective hydrogenation while the rest of the wafer remains at a much lower temperature. This allows for hydrogenation of controlled areas of the wafer. While the light and heat sources are removed simultaneously when using a laser, the charge states in the local region being processed can remain in a desirable state long enough to allow adequate cooling to take place without losing the effect of the hydrogenation.

Example 9

Use of Laser for Controlled Re-Activation of Dopant Impurities

For heavily doped p-type silicon conditions are such that $H^+$ will be the dominant Hydrogen species. This $H^+$ effectively passivates the boron acceptors in such regions and has very low mobility (similarly for other p-type dopants such as if gallium or aluminium). In order to undo this passivation of acceptors it is necessary to provide heat and light such that there are a reasonable number of electrons in the region. By using a laser to supply heat and light, localised areas of passivated boron (or gallium or aluminium) may be reactivated to their original heavy doping.

Example 10

Hydrogenation of Finished Cells

An advantage of localised hydrogenation is the ability to perform hydrogenation without heating the entire area of the wafer. There are some area's such as intentionally heavily doped regions, metal contacts or regions of high thermal expansion mismatch that would degrade with a typical hydrogenation process but if localised hydrogenation is used these areas may remain unperturbed. This would allow hydrogenation of finished devices by applying heat and light to regions where there are no metal contacts or other structures that it is undesirable to interfere with.

Advanced Implementation

Tailored Emitter for in-Diffusion

To maximise H⁰ generation, the Fermi level should be approximately 0.1 to 0.22 eV above mid-gap, depending on the temperature. For Fermi levels lower than this level, $H^+$ is the dominant charge species of hydrogen whilst for Fermi levels higher than this level, $H^-$ is the dominant charge species of hydrogen. Ensuring a Fermi level of around this level allows a good penetration of hydrogen as H⁰ and $H^+$ throughout the device. As shown in FIG. 10, for lightly doped n-type silicon such as the bulk doping density for n-type silicon solar cells typically in the range of $1\times10^{15}/cm^3$-$1\times10^{16}/cm^3$ low temperatures can be used to achieve the desired Fermi level. However for n-type diffusions in silicon, the doping density is typically greater than $1\times10^{19}/cm^3$, and much higher temperatures must be used to obtain a Fermi level in the range of 0.1-0.22 eV above mid-gap.

If the emitter does not have to carry current then it may be optimised for hydrogen penetration, however if it does have to carry current then there is a trade-off between emitter sheet resistance and the temperature needed for effective hydrogenation.

Another approach is Tailoring of emitters to maximise H⁰ generation. If the junction is not required to carry current great distances (or not at all e.g. a front junction on a rear contact cell or a rear floating junction) then it may be tailored to have a Fermi energy close to the ideal 0.15-0.2 eV above mid-gap for $H^0$ generation for much of it's depth at a certain desired temperature (the hydrogenation process temperature). A rear floating junction optimised for $H^0$ generation may be used to advantage, in which case modelling may be used to determine an ideal floating junction for a given cell design. This should allow the creation an area optimised for $H^0$ generation over most of the back surface providing a source for hydrogen in-diffusion.

Hydrogen Trapping

In order to maximise the effectiveness of hydrogenation it is necessary to prevent hydrogen from escaping the wafer during hydrogenation or any subsequent processes. Furthermore it is undesirable to hydrogenate some regions, most notably metal contacts, which rely on a damaged surface to form an ohmic contact. The other features that hydrogen should be prevented from reaching are hydrogen sinks, the most common of which in production cells being aluminium alloyed regions and metal/silicon interfaces.

Various methods of preventing hydrogen escape and controlling hydrogenation are outlined below.

i) Hydrogen sources can be provided on both sides of the cell (the hydrogen diffusion gradient will then prevent escape from surfaces)

ii) Use of heavily doped regions (not aluminium alloyed regions), in strategic locations to block the hydrogen flow. Such heavily doped regions greatly decrease hydrogen mobility and control the charge state of the hydrogen, effectively blocking diffusion through these regions. An example of such a region is a heavily doped region under an emitter contact.

iii) Use of internal electric fields to repel hydrogen of a particular charge state or to encourage it's in-diffusion.

Use of Surface Charge

Positively charged surfaces may be used to invert a p-type surface, with the depth of this layer dependent upon the charge carrier concentrations in the underlying material. This inverted region should then have high equilibrium concentrations of $H^0$ and $H^-$.

Surface charge in silicon nitride or silicon oxynitride is positive and to some degree controllable and may be used to tailor this parameter. In addition anodic aluminium oxide increases the surface positive charge density when applied over these layers, increasing the potential range of manipulation.

Example Structures

A number of example structures that may be used to allow effective hydrogenation are presented below. These are by no means exhaustive but are useful for illustrating some of the design principles outlined above.

Example 11

Double Sided Hydrogen Source with Screened Contacts

Figure 11:
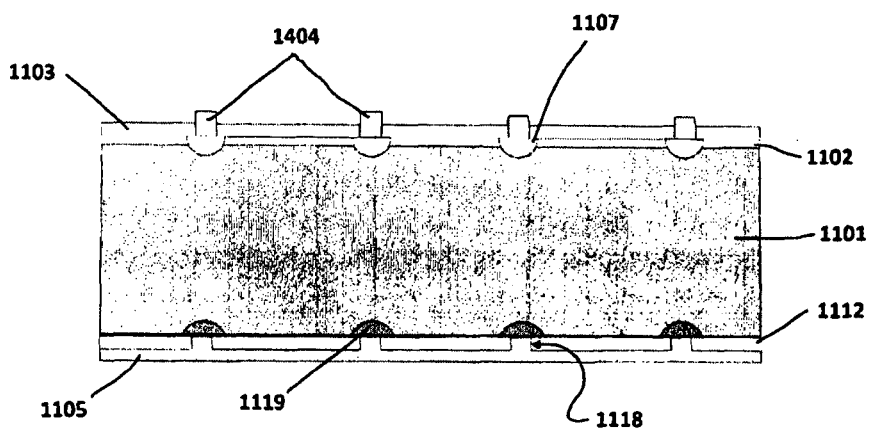
FIG. 11 diagrammatically illustrates a cell having a double sided hydrogen source with screen printed contacts FIG. 12 diagrammatically illustrates a cell having a double sided hydrogen source with a floating junction.

Referring to FIG. 11, a solar cell is illustrated with a Double Sided Hydrogen Source (DSHS Cell) with screen printed contacts is illustrated diagrammatically. This cell has a substrate 1101 of p-type material, with a lightly doped n-type emitter region 1102 with heavily doped n-type regions 1107 under front metal contacts 1104 which pass through a front surface dielectric layer 1103 acting as a passivation layer and hydrogen source. The rear surface has a rear dielectric layer 1112 which acts as a passivation layer and hydrogen source. The rear metal contact 1105 passes through the rear dielectric 1112 at discrete points 1118 under which are formed heavily doped $P^+$ regions 1119 which isolate the rear metal point contacts 1118 from the substrate 1101.

Example 12

Double Sided Hydrogen Source with Floating Junction

Figure 12:
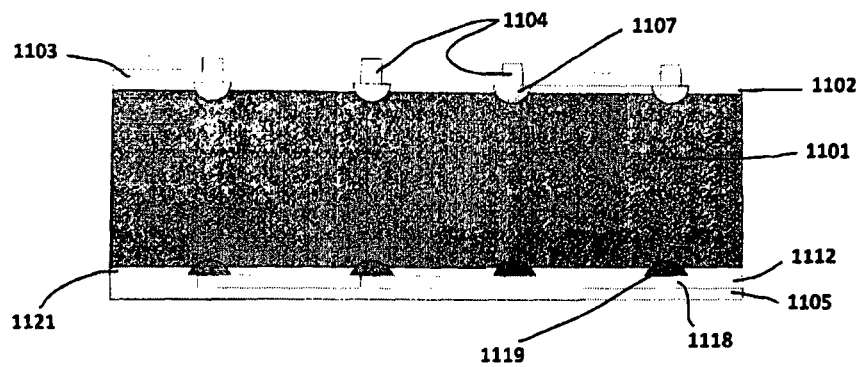

FIG. 12 illustrates a DSHS cell with a rear floating junction. This cell is essentially the same as the illustrated in FIG. 11 except that an n-type rear floating junction 1221 is formed between the substrate 1101 and the rear dielectric layer 1112 and formed either by diffusion or by inversion with surface charge. The n-type region 1221 is intended to increase passivation and enhance $H^0$ generation and the $p^+$ regions 1119 extend through the n-type region 1221.

Example 13

Single Sided Hydrogen Source with Rear Trap

Figure 13:
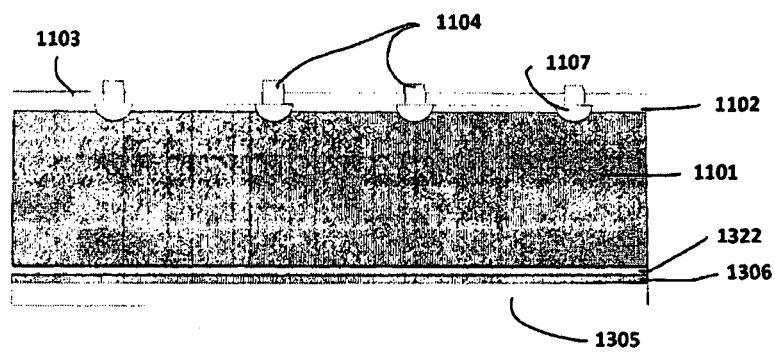
FIG. 13 diagrammatically illustrates a cell having a single sided hydrogen source with a rear trap.

FIG. 13 illustrates a single sided hydrogen source with a rear trap, which has a front surface structure similar to those of the cells illustrated in FIGS. 11 & 12. The rear of the cell illustrated in FIG. 13 differs in that the rear metal contact 1305 contacts the entire rear surface, as in the screen printed solar cell described previously, and the alloyed region 1306 (aluminium, silicon alloy) beneath the aluminium rear contact 1305 is separated from the substrate 1101 by a trap 1322. The trap 1322 may be formed as a heavily boron (or gallium or aluminium) doped (i.e. $p^{++}$) region or an internal electric field, formed for example by a doping gradient.

Example 14

Processing Sequence for a LDSE) Solar Cell

A possible processing sequence for Double Sided, Laser Doped, Selective Emitter (LDSE) Solar Cell formed with low quality monocrystalline wafers will now be described:

1. Alkaline Texturing:

Alkaline texturing is performed to remove saw damage from the surface of the wafer and produce a surface with regular pyramids consisting of exposed 111 planes less than in the order of 5 um in width. This is achieved by immersing wafers in a chemical bath containing a low concentration (<5%) potassium hydroxide etch with Iso-Propanol (IPA). Alternately new solutions are being produced which can achieve the same results without using IPA.

Figure 14:
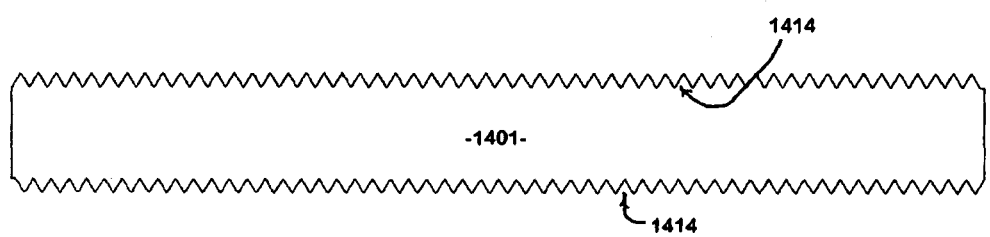
FIGS. 14 to 22 show process steps in a first possible manufacturing process.

A product of his initial step is seen in FIG. 14 in which:

a p-type silicon wafer 1401 is used having a Bulk Doping of $1 \times 10^{15}$ to $1 \times 10^{17}$ atoms/cm$^3$;

the wafer has an alkaline textured surface, with pyramids 1414 having a base width of less than in the order of 5 um.

2. Pre-Diffusion Clean:

A pre-diffusion clean is used to remove any contaminants from the surfaces of the wafer 1401 prior to subsequent high temperature diffusion and drive-in steps. This is achieved by immersing the wafers 1401 in cleaning solutions. The cleaning solutions may range from:

1) the most thorough RCA (ECN) clean which consists of 3 steps, an alkaline clean to remove organics, an acidic etch to remove metals and then an HF dip to remove any native oxide;

2) a combined HCL:HF clean which is used in most commercial applications to remove metallic impurities, 3) an HCL clean followed by an HF dip which is the next most commonly used alternative;

3. Phosphorous Diffusion: Monocrystalline Low Purity Silicon

Front and rear phosphorous diffusions are used to achieve a surface concentration of less than $1\times10^{20}$ atoms/cm$^3$ and emitter sheet resistance of ~>150 ohms/sq (industry standard for selective emitter designs is 100-120 ohms/sq with surface concentration)~$2\times10^{20}$. This is achieved using a heavy diffusion (20-50 ohms/sq) followed by an etch back to create the desired sheet resistance. Alternately a light diffusion may be used with a long drive in which may also give the same result.

Figure 15:
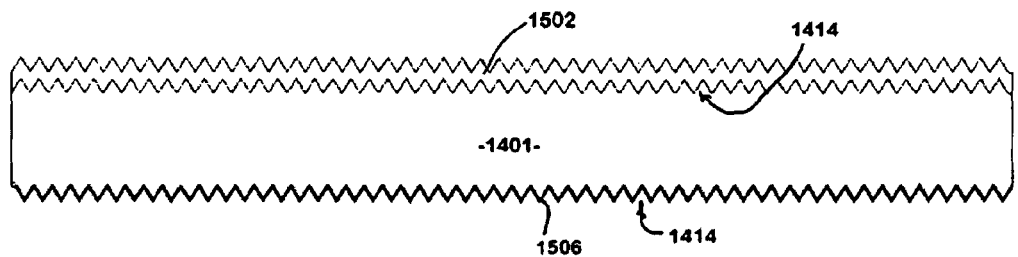

Referring to FIG. 15 the above process results in the following additional features seen in the drawing:

The rear Surface Phosphorous Diffusion may result in a lighter rear surface diffused region 1506 than the subsequent front surface diffusion, resulting in Sheet Resistance>200 Ω/sq, and a surface concentration<$1\times10^{19}$ atoms/cm$^3$, however the rear surface diffused 1506 might also be of similar concentration to the front surface diffusion.

Figure 16:
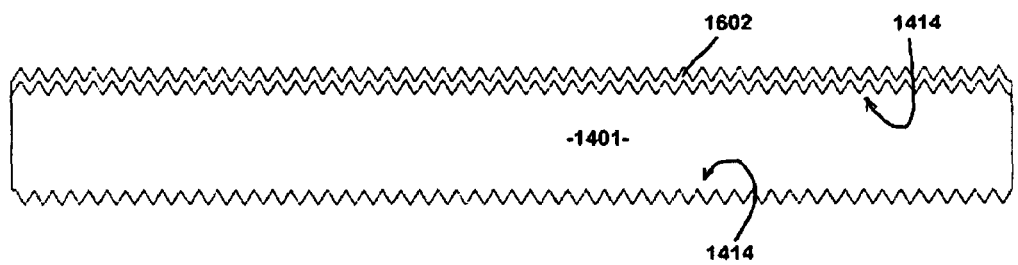

The front Surface Phosphorous Diffusion will advantageously result in a front surface diffused region 1502 having a sheet resistance of 120-200 Ω/sq, and a Surface Concentration<$1\times10^{20}$ atoms/cm$^3$ 4. Rear Etch Back The phosphorous that has diffused into the rear surface of the silicon wafer and has formed an emitter region there is removed by a rear etch back process. This is achieved by exposing only the rear surface to an etching solution that removes the region of the silicon wafer at the rear that contains phosphorous. This is achieved in current commercial implementations by moving the wafer 1401 over a chemical bath. A wave motion is then generated in the bath which allows the chemicals to reach the rear surface of the wafer but not the front. Vapours from the chemical bath may also act to etch back the front surface slightly and this can be used in place of a front etch back to reduce the surface concentration of the front emitter. This etch may also advantageously planarise the rear surface FIG. 16 shows the state of the wafer after the rear surface etch-back has removed the p$^+$ doped layer 1506.

5. PECVD Hydrogen Source Deposition

A dielectric layer is deposited over the front and rear surfaces that will act as a hydrogen source for later hydrogenation annealing. Advantageously the dielectric layer will contain at least 10% atomic hydrogen. The dielectric layer may also advantageously provide good surface passivation and act as an anti-reflection coating. This may be achieved by the incorporation of hydrogen ions into a Silicon Nitride or Silicon Oxy-nitride film grown using Plasma Enhance Chemical Vapour Deposition (PECVD). In both cases silane (SiH$_4$) is commonly used as the source of both silicon and hydrogen to be incorporated into the film.

Figure 17:
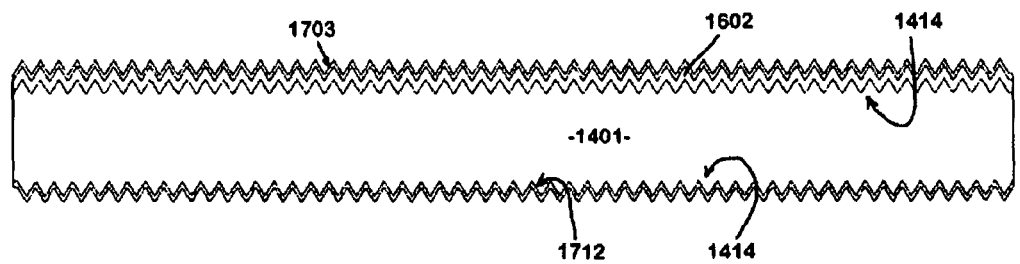

Referring to FIG. 17 the device is shown as it appears after the Hydrogen Source Deposition in which:

a front surface dielectric and hydrogen source 1703 has been deposited comprising SiN$_x$—H$_y$ or SiO$_x$N$_y$—H$_z$, containing at least 10% atomic hydrogen, with minimised reflection at ~600 nm, and a refractive index of between 1.8-2.5;

a rear surface dielectric and hydrogen source 1712 has been deposited comprising SiN$_x$—H$_y$, SiO$_x$N$_y$—H$_z$ or AlO$_3$, and at least 10% atomic hydrogen, with a refractive index 2.0-3.0

6. Rear Laser Doping

A patterned region is created on the rear surface which is suitable for metal contacting (either line openings or point contacts). The pattered region consists of regions where the dielectric overlying the substrate has been ablated away and the underlying silicon regions have been heavily doped to p-type.

Figure 18:
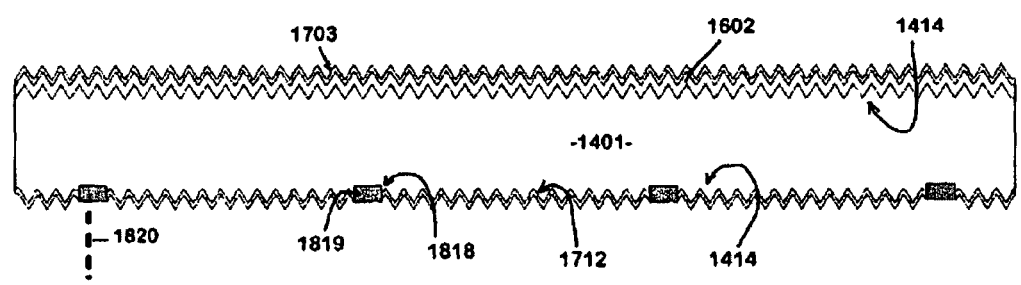

To achieve this, the rear surface of the wafer is coated with a boron source (boron spin-on dopant—e.g. Poly Boron Film (PBF1)). Referring to FIG. 18 a laser 1820 is then used to simultaneously create the openings in the dielectric 1712 and dope the underlying silicon by creating a molten region which mixes the boron source with the silicon. Although boron is used in this example germanium or aluminium could also be used as the p-type dopant.

In FIG. 18 boron laser doped regions 1819 can be seen, formed under openings 1818 in the dielectric 1712. The depth of the doped regions 1819 is 2-10 um, with doping>$1\times10^{18}$ atoms/cm$^3$.

7. Front Laser Doping

Figure 19:
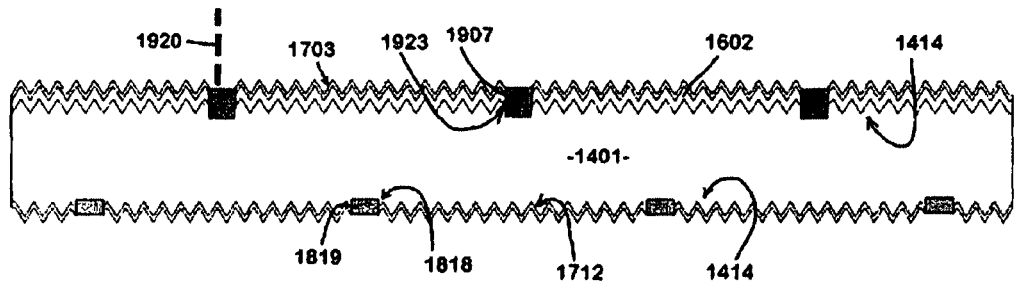

A pattern consisting of heavily doped n-type regions is created on the front surface, suitable for metal contacting (fingers and busbars). As with the rear surface the dielectric on the front surface is also ablated away in the areas overlying the regions where the heavily doped n-type material is to be formed. Referring to FIG. 19, this is achieved by coating the front surface of the wafer 1401 with a phosphorous source (e.g. phosphoric acid—H$_3$PO$_4$), and a laser 1920 is then used to simultaneously create the openings in the dielectric 1703 and dope the underlying silicon by creating a molten region which mixes the phosphorous source with the silicon.

In FIG. 19 phosphorous laser doped regions 1907 can be seen, formed under the openings 1923 in the front surface dielectric 1703. The depth of the resulting n-type region is 2-10 um, with a doping of greater than $1\times10^{19}$ atoms/cm$^3$.

8. High Temperature Hydrogenation

High Temperature Hydrogenation is performed using a modified belt furnace (see FIG. 31), such that the illumination during the anneal and cool-down is maintained at a level exceeding 1 sun. This may be realised through the use of lamps positioned directly over the wafers and the belt. Advantageously these lamps may also be the source of both the heat and the illumination for the hydrogenation process. Wafers may be heated to a temperature between 600 and 800° C. with illumination as bright as practicable (with respect to safety etc., up to 100 suns). The wafers need only be exposed to this temperature for between 5 seconds and a minute. Alternatively annealing might be at a lower temperature for a longer period such as at 350° C. for 15 minutes and generally speaking between 300-400° C. for 10-20 min.

Illumination during cool down is advantageously greater than 1 sun, ideally generating enough carriers to maintain an electron quasi fermi energy of greater than 0.1 eV above mid-gap. An upper limit on illumination is given by the requirement for the wafers to cool at a reasonable rate, therefore heat generated by the illumination must be much less than the heat loss from the wafers to their surroundings. This may be achieved by reducing the temperature of the illumination or by cooling the atmosphere. Alternatively the illumination may be pulsed and rely on the lifetime of the material to maintain sufficient minority concentrations and hence minority hydrogen charge species concentrations in between successive pulses.

9. Aluminium Sputtering

Figure 20:
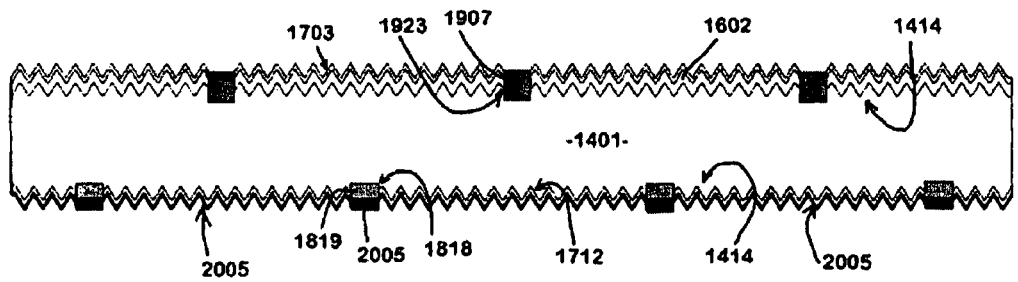

A layer of aluminium is coated onto the rear surface of the wafer to act as the rear electrode. This is achieved by sputtering aluminium in a low pressure chamber onto the rear of the wafer. This should coat the rear of the device without affecting the dielectric such that aluminium contacts any exposed silicon on the rear and there is no contact anywhere else. Between 1 and 20 um of aluminium should be deposited Referring to FIG. 20 the rear aluminium contact 2005 is applied by sputtering over the p-type regions 1819 and the remaining dielectric layer 1712, with 1-20 um depth of aluminium.

10. Nickel Light Induced Plating

A thin layer (<2 um thick) of nickel is deposited to adhere to and contact the silicon of the n-type regions 1907 on the front of the wafer 1401. This is achieved by illuminating the wafer (with illumination levels of in the order of 1 Sun) while immersed the wafer in an electrolyte containing nickel. The electrical potential developed across the wafer under illumination drives a plating reaction where nickel is deposited on exposed n-type silicon. The plating potential may alternately be provided or enhanced using external electrodes with an applied auxiliary source of electrical potential.

11. Nickel Sintering

The nickel is sintered such that good adhesion between the nickel and the silicon surface is realised. A short anneal at temperatures in between 300 and 500° C. in a nitrogen ambient will provide sufficient sintering. In Industry this is usually carried out in a belt furnace. To maintain good hydrogenation bright illumination is advantageously provided in the nickel sinter furnace and in the cooling region where the wafers are still at elevated temperatures.

Figure 21:
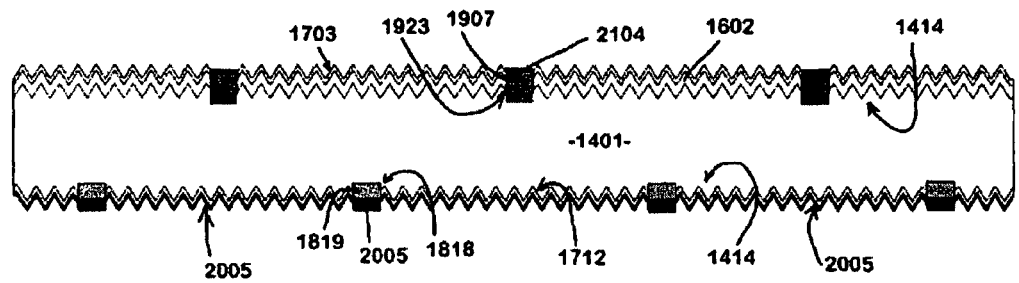

Referring to FIG. 21 the n-type regions 1907 are plated with nickel 2104, which is sintered with hydrogenation occurring during the sintering step. The nickel plated contacts are <2 um thick.

In order to promote hydrogenation during the nickel sinter step a modified belt furnace could be used. In this furnace, the lamps used will advantageously emit illumination primarily in the visible to near infra-red range, to provide both the temperature and the illumination in the heating regions. A nitrogen is preferably maintained in the heating region. Advantageously also the wafer 1401 may be exposed to temperatures between 350-450° C. for up to 5 minutes and then cooled.

Illumination is also advantageously maintained during cooling by means of lamps as above and cooling may be achieved by either cooling the atmosphere or by modifying the intensity of the lamps such that the wafers may still cool at a rapid rate.

12. Copper Light Induced Plating

A layer of copper (up to 20 um thick) is then plated over already deposited nickel to act as the current carrier in the front metal contact. This is achieved by illuminating the wafer 1401 (at an illumination of in the order of 1 Sun) while it is immersed in an electrolyte containing copper. The electrical potential developed across the wafer under illumination drives a plating reaction whereby copper is deposited on top of the existing nickel layer 2104. The plating potential may alternately be provided or enhanced using external electrodes with an applied source of auxiliary electrical potential.

Figure 22:
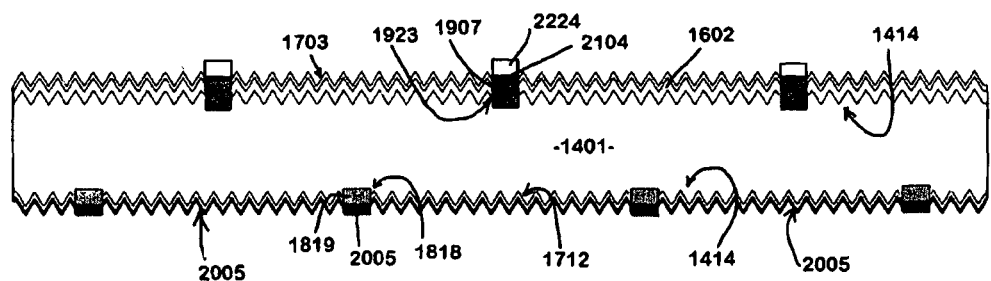

Referring to FIG. 22 the nickel front contacts 2104 are plated with a copper layer 2224, where the copper is up to 20 um thick.

Example 15

Processing Sequence for a LDSE Solar Cell with Rear Floating Junction

Another possible processing sequence for Double Sided, Laser Doped, Selective Emitter (LDSE) Solar Cell with Rear Floating Junction formed with Multicrystalline Wafers will now be described:

1. Acidic Texturing

Figure 23:
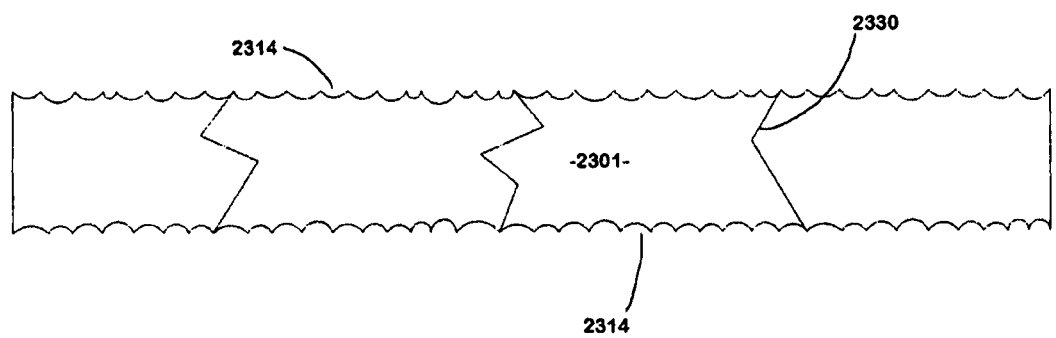
FIGS. 23 to 30 show process steps in a second possible manufacturing process.

Referring to FIG. 23, the process starts with a P-type multicrystalline silicon wafer 2301, with Bulk Doping of $1 \times 10^{15}$ to $1 \times 10^{17}$ atoms/cm$^3$. The multicrystalline silicon wafer 2301 includes internal Grain Boundaries 2330, which are significant recombination sites. An acid etch is used to remove saw damaged regions from the surface of multicrystalline wafer and to create a roughened surface in order to reduce reflection. This is achieved by immersing the wafers in an acidic etch containing HF and HNO3, which etches back the silicon surface of the wafer 2301. Because the etching is greatly accelerated in defected regions due to the exothermic nature of the reaction, etch holes (or pits) 2314 are created on the surface which act to roughen the surface of the wafer to assist light trapping in the finished device. These etch holes will typically have a feature size of less than 20 um 2. Pre-Diffusion Clean A pre-diffusion clean is performed to remove any contaminants from the surfaces of the wafer 2301 prior to high temperature diffusion and drive-in steps (to follow).

The clean is achieved by immersing the wafers in cleaning solutions, which may comprise the most thorough RCA (ECN) clean which consists of 3 steps:

i) an alkaline clean to remove organics,
   ii) an acidic etch to remove metals and
   iii) an HF dip to remove any native oxide.

Alternatively the clean may comprise a combined HCL:HF clean, which is used in most commercial applications to remove metallic impurities. Finally an HCL clean followed by an HF dip may be used which is the next most common commercially used alternative.

3. Phosphorous Diffusion: Multi, Low Purity, Front and Rear Junction

Figure 24:
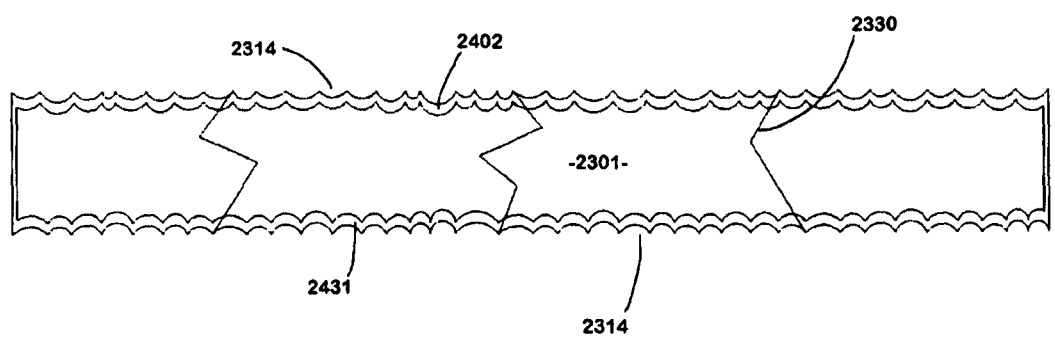

A phosphorous diffusion is used to create a front junction between the bulk of the substrate 2301 and the front diffused region 2402 and a rear floating junction between the bulk of the substrate 2301 and the rear diffused region 2431, and as seen in FIG. 24. The front diffusion 2402 will advantageously have a final surface concentration below $1 \times 10^{20}$ atoms/cm$^3$, a sheet resistance between 120 and 200 ohms/sq and significant phosphorous diffusion down grain boundaries 2330 to isolate the grain boundaries from p-type bulk and reduce hydrogen lost at the grain boundaries.

For low purity multicrystalline wafers the phosphorous diffusion should ideally be initially heavy (between 20 and 50 ohms/sq) with a long low temperature (<800° C.) drive in step to allow phosphorous to diffuse down and electrically isolate grain boundaries 2330.

This should be followed by an etch back to reduce the front surface concentration below $1 \times 10^{20}$ atoms/cm$^3$ and provide a final emitter sheet resistance of between 120 and 200 ohms/sq. An alternate approach is to perform light phosphorous diffusion with a long drive in (at low temperature) to achieve the same outcome.

In this implementation both sides should be diffused simultaneously with the rear surface either receiving a lower dose of phosphorous or being etched back to a great degree such that the rear diffused region 2431 is created with a sheet resistance>250 ohms/sq and a surface concentration less than $2 \times 10^{10}$ atoms/cm$^3$.

4. PECVD Hydrogen Source Deposition (Both Sides)

Figure 25:
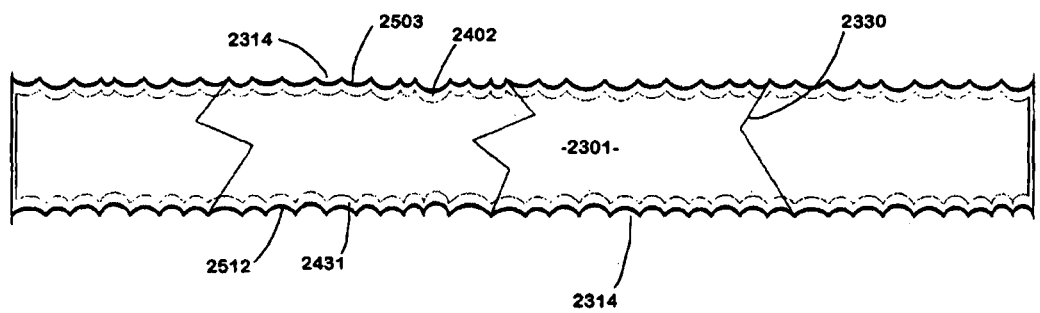

Referring to FIG. 25 a front dielectric layer 2503 and a rear dielectric layer 2512 are then deposited to act as a hydrogen sources for later hydrogenation annealing. The dielectric layers 2503 and 2512 should contain at least 10% atomic hydrogen. Advantageously the dielectric layers 2503 and 2512 may also provide good surface passivation and act as an antireflection coating. This may be achieved by the incorporation of hydrogen ions into a Silicon Nitride or Silicon Oxy-nitride film grown using Plasma Enhance Chemical Vapour Deposition (PECVD). In both cases silane (SiH4) is commonly used as the source of both silicon and hydrogen to be incorporated into the film. The wafer 2301 should be cleaned and any surface oxide film removed using an HF solution prior to deposition. The front dielectric layer 2503 may advantageously have a minimised reflection at 600 nm and a refractive index 1.8-2.5, while the rear dielectric layer 2512 should preferably have a refractive index of 2.0-3.0.

5. Rear Laser Doping

Figure 26:
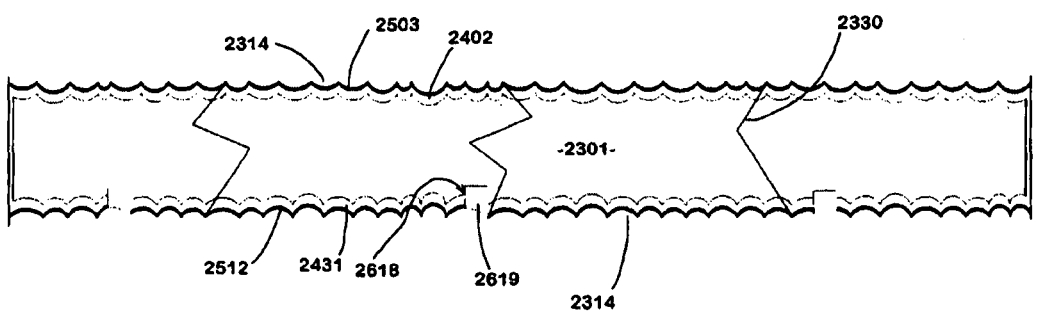

A heavily doped pattern of p-type regions 2619 is then created through the rear dielectric layer 2512 on the rear surface, as seen in FIG. 26, suitable for metal contacting (either line openings or point contacts). To create the heavily doped p-type regions 2619, the rear surface is coated with a boron source (boron spin-on dopant—Poly Boron Film (PBF1)) and a laser 1920 is then used to simultaneously create openings 2618 in the dielectric layer 2512 and to dope the underlying silicon by creating a molten region which mixes the boron source material with the silicon to form the heavily doped pattern of p-type regions 2619 with a depth of 2-10 um, and a doping concentration of greater than $1\times10^{18}$ atoms/cm$^3$. Note that other p-type dopants such as gallium or aluminium might also be used instead of boron.

6. Front Laser Doping

Figure 27:
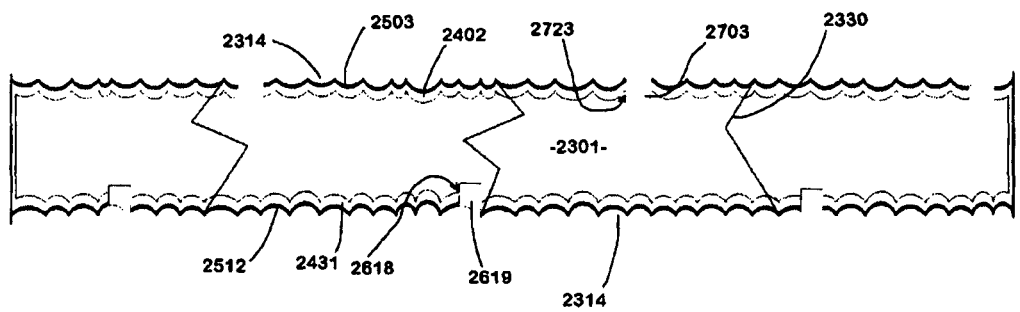
Figure 28:
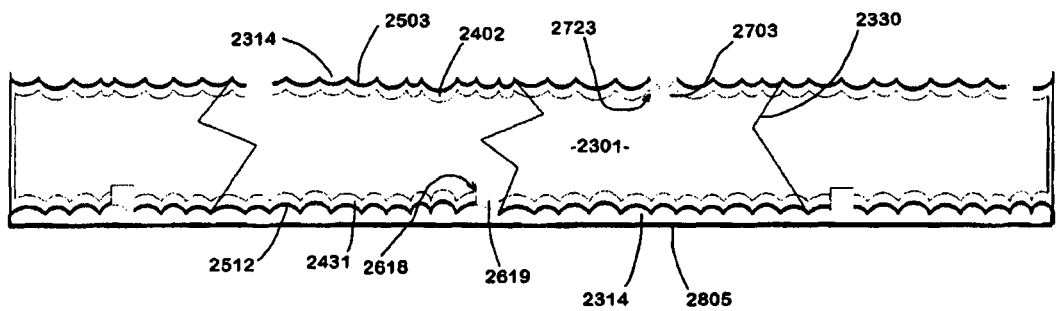

A heavily doped pattern of n-type regions 2707 is then created through the front dielectric layer 2503 on the front surface, as seen in FIG. 27, suitable for metal contacting (fingers and busbars) to the emitter 2402. To create the heavily doped n-type regions 2707 the front surface is coated with a phosphorous source (phosphoric acid) and a laser 1920 is then used to simultaneously create openings 2723 in the dielectric layer 2503 and to dope the underlying silicon by creating a molten region which mixes the phosphorous source material with the silicon to form the heavily doped pattern of n-type regions 2707 with a depth of 2-10 um, and a doping concentration of greater than $1\times10^{19}$ atoms/cm$^3$.

7. High Temperature Hydrogenation

A high temperature hydrogenation step is performed using a modified belt furnace, such that the illumination during the anneal and cool-down is maintained at a level exceeding 1 sun. This is realised by the use of lamps positioned directly over the wafers 2301 and the belt. These lamps would be the source of both the heat and the illumination for the hydrogenation process.

Wafers are heated to a temperature between 600 and 800° C. with illumination as bright as practicable (with respect to safety etc., up to 100 suns). The wafers need only be exposed to this temperature for between 5 seconds and a minute. Alternatively, as with the previous example, annealing might be at a lower temperature for a longer period such as at 350° C. for 15 minutes and generally speaking between 300-400° C. for 10-20 min.

Illumination during cool-down should be greater than 1 sun, ideally generating enough carriers to maintain an electron quasi fermi energy of greater than 0.1 eV above mid-gap. An upper limit on illumination is given by the requirement for the wafers to cool at a reasonable rate, therefore heat generated by the illumination must be much less than the heat loss from the wafers to their surroundings. The annealing step may be performed in a belt furnace as described below with reference to FIG. 31.

8. Aluminium Sputtering

A layer of aluminium 2805 is coated over the rear surface of the wafer to contact the heavily doped p-type regions 2619 and to act as the rear electrode. This is achieved by sputtering aluminium in a low pressure chamber onto the rear of the wafer. This should coat the rear of the device without affecting the dielectric layer 2512 such that the aluminium layer 2805 contacts any exposed silicon of the heavily doped p-type regions 2619 on the rear and there is no contact anywhere else. Advantageously a thickness of between 1 and 20 um of aluminium may be deposited.

9. Nickel Light Induced Plating

Figure 29:
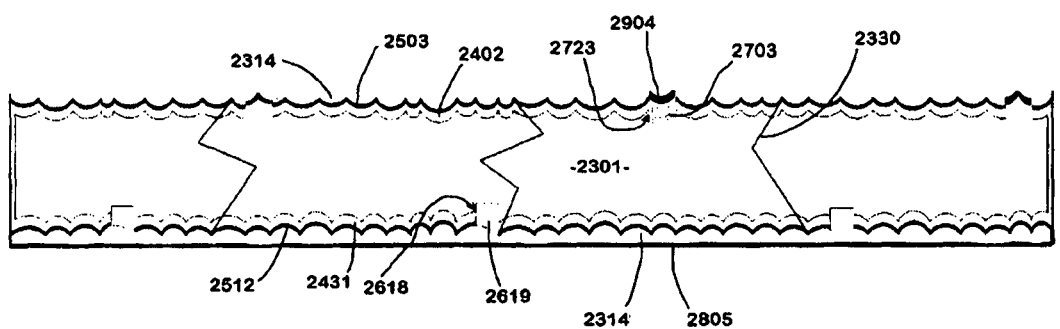
Figure 30:
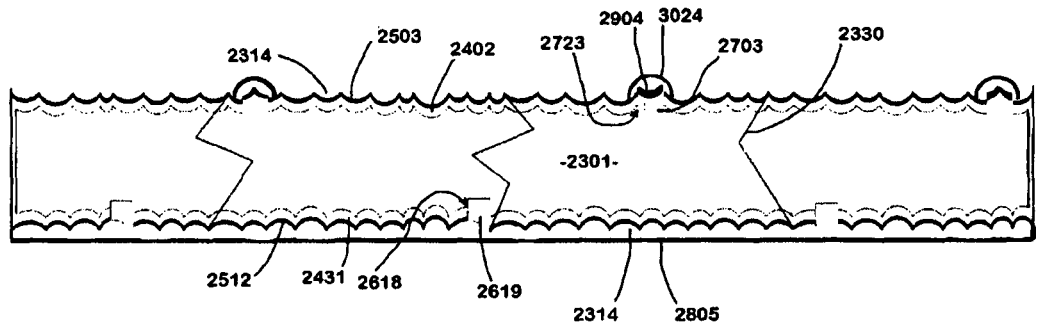

As seen in FIG. 29, a thin layer (<2 um thick) of nickel 2904 is plated over the heavily doped n-type regions 2707 on the front of the wafer 2301 to adhere to and contact only the silicon in the heavily doped n-type regions 2707.

This is achieved by illuminating the wafer 2301 (in the order of 1 Sun) while the wafer is immersed in a nickel containing electrolyte. The electrical potential developed across the wafer 2301 under illumination drives a plating reaction where nickel is deposited on exposed n-type silicon.

The plating potential may alternatively be provided or enhanced by using external electrodes with an applied auxiliary source of electrical potential.

10. Nickel Sintering

The layer of nickel 2904 over the heavily doped n-type regions 2707 on the front of the wafer 2301 require sintering such that good adhesion is achieved between the nickel and the silicon surface. A short anneal at temperatures in between 300 and 500° C. in a nitrogen ambient is sufficient and the standard method used in the PV industry to achieve the required sintering is usually carried out in a belt furnace. To maintain good hydrogenation there should be bright illumination in the nickel sinter furnace and in the cooling region where the wafers are still at elevated temperatures.

11. Nickel Sintering with Improved Hydrogenation (Alternative to Nickel Sintering Described Above)

In order to promote hydrogenation during the nickel sinter step a modified belt furnace may be used. In the modified belt furnace, simultaneous heating and illumination may be achieved by using furnace lamps in the heating regions which emit light primarily in the visible to near infra-red range. The wafers may also be advantageously maintained in a nitrogen atmosphere while they are in the heating regions. Advantageously the wafers may be exposed to temperatures between 350-450° C. for up to 5 minutes and then cooled. During cooling, illumination may be maintained by means of lamps as above while using cooling air or modified lamp intensity to cool the wafers at a rapid rate.

12. Copper Light Induced Plating

A high current conductor is required over the layer of nickel 2904 to act as the current carrier of the front metal contact and this is provided by plating over the nickel layer 2904 with a layer of copper which can be up to 20 um thick. The copper plating is achieved by illuminating the wafers 2301 (with illumination levels of in the order of 1 Sun) while the wafers are immersed in an electrolyte containing copper. The electrical potential developed across the wafer under illumination drives a plating reaction whereby copper is deposited on top of the existing nickel layer 2904 to form the copper capping 3024.

The electrical potential developed across the wafer 2301 may alternatively be provided or enhanced by using external electrodes with an applied auxiliary source of electrical potential.

Belt Furnace Modification

Figure 31A:
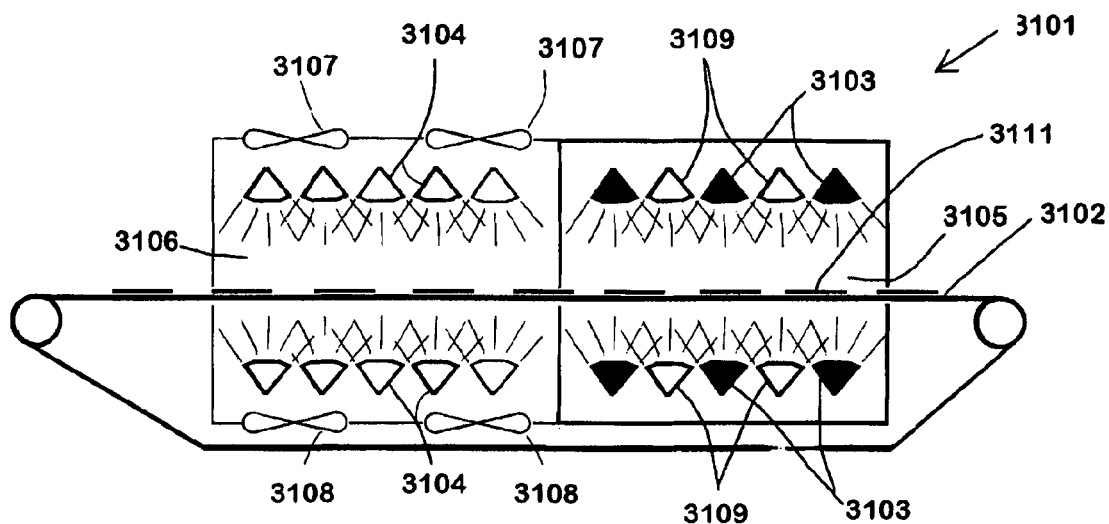
FIGS. 31a & 31b diagrammatically illustrate two examples of belt furnaces modified to provide illumination in the heating and cooling zones.

Referring to FIG. 31*a*, a first modified belt furnace 3101 is illustrated. As with a conventional belt furnace, the furnace of FIG. 31*a* has a heat resistant belt 3102 (e.g. a metal link style belt which passes through the furnace and extends from each end for loading and unloading. The furnace has a heating zone 3105 and a cooling zone 3106. Through which the belt passes. As with some conventional belt furnaces the heating zone has heating lamps 3103 which direct heat at the belt 3102 and anything carried on the belt, such as a wafer 3111 undergoing hydrogenation in the process to make a solar cell. The heating lamps 3103 typically produce radiant heat and may be high powered lights which produce large amounts of radiant heat such as infra-red lamps. In the present modified belt furnace, the heaters may be high powered lights which are chosen (or driven differently) to also provide high levels of light. Alternatively supplementary lighting 3109 may optionally also be provided. Ideally light levels of up to 100 suns might be provided in the heating zone 3105. In the cooling zone of a conventional belt furnace, cooling is performed in the dark. However in the present modified belt furnace 3101, lamps 3104 are provided in the cooling zone 3106 such that solar cells processed in the belt furnace may be illuminated during cool-down. The lamps 3104 in the cooling zone may advantageously provide less heating than the lamps in the heating zone. This may be achieved by using cooler or more efficient (e.g. non infra-red) lamps or by using infra-red-lamps and taking measures to minimise the heating effect or to provide additional forced cooling. For example the lamps 3104 in the cooling zone 3106 may be pulsed (taking advantage of the lifetime of the light induced charge states) to reduce their average heat output. Alternatively the cooling zone 3106 may optionally be cooled by passing cooling air through the cooling zone using inlet fans 3107 and exhaust fans 3108 to counteract any heating effects of the lamps 3104, to more rapidly bring the target device below a temperature at which the hydrogen passivating defects in the device will become stable. The cooling air may be chilled. Alternatively other gasses may be introduced at low temperature to assist cooling.

Figure 31B:
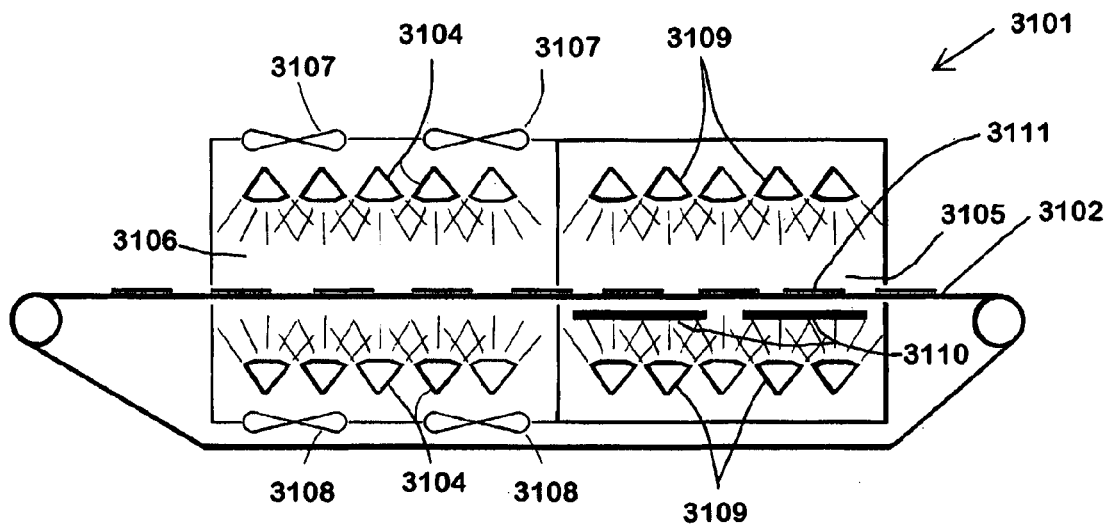

Referring to FIG. 31b, a second modified belt furnace 3101 is illustrated. As with a conventional belt furnace, and also the previous example, the furnace of FIG. 31b has a heat resistant belt 3102 (e.g. a metal link style belt which passes through the furnace and extends from each end for loading and unloading. The furnace has a heating zone 3105 and a cooling zone 3106, through which the belt passes. As with some conventional belt furnaces the heating zone in this case has plate heaters 3110 which direct heat from beneath the belt 3102 to heat anything carried on the belt, such as a wafer 3111 undergoing hydrogenation in the process to make a solar cell. In this case supplementary lighting 3109 is provided in the heating zone 3105, as there would be no lighting in the heating zone of a conventional belt furnace which used plate heaters. Again, ideally light levels of up to 100 suns might be provided in the heating zone 3105. In the cooling zone of a conventional belt furnace, cooling is performed in the dark. However in the present modified belt furnace 3101, as with the previous example, lamps 3104 are provided in the cooling zone 3106 such that solar cells processed in the belt furnace may be illuminated during cool-down. The cooling zone 3106 of FIG. 31b may be identical to that of FIG. 31a.

Pulsed Illumination

Advantageously, as mentioned above, pulsing of light sources may be used to implement the cool-down process following hydrogenation or other thermal processes. Pulsed illumination allows control of the carrier concentrations (and hence hydrogen charge state) while minimising the energy incident on the wafers to facilitate cooling.

In general terms, time varying of light such as by pulsing or ramping of light intensity, allows control of the hydrogen charge state, particularly during variations in temperature which normally cause changes in the charge states and which are often uncontrollable. Even during the peak temperatures of hydrogenation, using pulsed illumination allows carrier concentrations to be shifted within a range that allows generation of each of the charge states for the hydrogen. This increases the reactivity of the hydrogen for passivating the various defects and contaminants within the silicon.

Pulsing of the illumination also allows advantage to be taken of the lifetimes of the different hydrogen charge states. For example, it is advantageous to have electrons associated with the H atoms in p-type silicon, as electrons are required for bonding of hydrogen to some defects. The lifetime of the hydrogen species is finite and dependent on the charge state. For example, H− is relatively stable with a lifetime of typically 1 second, and thus the p-type silicon can be pulsed with a short pulse of illumination of say a few milliseconds followed by removal of the illumination for say 100 times longer (i.e. a few hundred milliseconds) during which time the H atom can remain in its negative charge state providing electrons for the bonding to defects. As a general rule, to maintain a desired charge state, the light can be pulsed with a period just shorter than the expected lifetime of the desired charge state species. This avoids dumping large amounts of thermalisation energy into the silicon, thus disturbing the minority carrier concentration, and alleviates the requirement for selecting an illumination source with energy (frequency) just above the bandgap energy. High concentrations of all charge states are required for passivating a wide range of defects. Therefore, rather than trying to precisely control the illumination level as the sample cools it may be easier to pulse the light with a pulsing period just shorter than the lifetime of the hydrogen species with shortest lifetime, thus easily generating high concentrations of all the hydrogen charge states.

Both $H^-$ and $H^0$ are much more reactive in p-type silicon but they are very rare at low temperatures. The problem with high temperature processing where $H^-$ and $H^0$ are more plentiful is that the silicon must be cooled down again after the process is completed and during the cool-down (in the dark), the H returns to H+ changing the point of equilibrium and many of the defects etc. are reactivated undoing much of the effect gained during the high temperature process. Illumination during hydrogenation allows more effective hydrogenation at lower temperatures. Illumination during cool down allows the control of the charge state of hydrogen to be extended to this stage of the process where previously the hydrogen reverted to an undesirable charge state. Varying the intensity of the illumination such as by pulsing and/or ramping the intensity of the illumination (or changing the duty cycle to effectively vary the illumination over time) allows greater control of the charge state of the hydrogen both during the heating stage and the cooling stage.

Example 16

Cool-Down, Following any Thermal Process (Such as Hydrogenation and Metal Sintering) Using Pulsed Lamps in the Cooling Zone of the Belt Furnace of FIG. 31a or 31b

This example uses a 0.3 ohm-cm p-type CZ wafer with hydrogen source dielectrics (such as $SiN_x$ or $SiN_xO_y$ or $AlO_x$) on both surfaces. For hydrogenation, the hot zone temperature may be 700° C., while the belt speed may be 5000 mm/min. With a length of the hot zone 3105 of 8 metres this gives a heating time of 67 sec (at such a high temperature, only a short period of time is required for the hydrogenation process—a lower belt speed may deplete the hydrogen sources). The peak light intensity for the light pulses from the auxiliary lamps 3109 (FIG. 31a or 31b) may be 5 W/cm², pulsed at a frequency 1 kHz with a pulse duration of 0.1 ms. In this example, pulsing is less important since the heating impact of a continuous auxiliary light source 3109 has less impact on temperature. However the pulsing or ramping of light intensity can still be beneficial to ensure that hydrogen exists in each of the charge states to enhance its reactivity. During heating, the power to the infra-red lamps 3103 (FIG. 31a) or the plate heaters 3110 (FIG. 31b) in the hot zone 3105 is controlled as required to achieve the set temperature of 700° C., however lamps adjacent to the entry end of the hot zone may be operated at a lower power in order to initially expose the cell to lower temperatures before gradually ramping up the temperature of the cell to the set temperature.

In the cooling zone, the lamps may be of a type which produces a low component of infra-red light with wavelengths longer than 1.2 microns. Depending on the type of lamp used, the lamps may be housed (mounted) in a reasonably heat resistant/tolerant fashion with mounting to withstand temperatures up to about 300° C. As seen in FIGS. 31a & 31b, the belt furnace design includes a wall separating the hot zone 3105 and the cooling zone 3106 with a small slit that allows the belt 3102 and wafers 3111 to pass through while minimising the heat transfer from the hot zone 3105 to the cooling zone 3106.

The lamps 3104 in the cooling zone 3106 may be an assembly of LEDs in a high density matrix, to allow light intensities onto the wafer surface in the range of 0.1 to 10 suns with a suitable spectrum. Optical elements may be used as necessary for focussing to increase the light intensity onto the wafer surfaces. The lamps 3104 may be pulsed at frequency in the range of 1 Hz to 1 kHz with corresponding pulse durations of 0.01 mS to 0.5 sec. For example, for a 0.3 ohm-cm p-type silicon wafer with hydrogen containing dielectric layers on both surfaces that has just completed a thermal process in the hot zones 3105 of the belt furnace and travels into the cooling zones 3106 with a belt speed of 5000 mm/minute, a high density array of high powered LED lights with wavelength in the vicinity of 1 micron and pulsed at 50 Hz and with a pulse duration of 1 ms may be used to provide the following lighting intensity gradient along the length of the cooling zone 3106:

0-20 cm into cooling zone—peak light intensity of 40 mW/cm²

20-40 cm into cooling zone—peak light intensity of 80 mW/cm²

40-60 cm into cooling zone—peak light intensity of 120 mW/cm²

60-80 cm into cooling zone—peak light intensity of 150 mW/cm²

80 cm into cooling zone and beyond—peak light intensity of 200 mW/cm².

The gradient in peak light intensities can of course be set up to be substantially continually variable (increasing) as a function of distance into the cooling zone. Ideally light intensities can be varied from 10 mW/cm² to 10 W/cm². As an alternative light source, pulses of laser light may be delivered into the cooling zone via optical fibres to achieve light intensities well above 10 W/cm² and for example up to 100 W/cm².

Cooling conditions should be such that the wafer temperature falls to below 100° C. before the wafer leaves the illumination of the cooling zone 3106.

Example 17

Hydrogenation at Low Temperatures (300° C.) Using Pulsed Light to Control Hydrogen Mobility and Reactivity by Controlling Hydrogen Charge States This example uses a 2 ohm-cm p-type CZ wafer with hydrogen source dielectrics (such as $SiN_x$ or $SiN_xOy$ or $AlO_x$) on both surfaces. For hydrogenation, the temperature of the hot zone 3105 may be 300° C. (no ramping is necessary in this case) while the belt speed may be 1000 mm/min over a length of 8 metres (at the lower hot zone temperature more time is preferable for the hydrogenation process). The peak light intensity for the light pulses from the auxiliary lamps 3109 (FIG. 31a or 31b) may be 1 W/cm², pulsed at a frequency 1 kHz with pulse duration of 0.1 ms. Peak light intensity for the light pulses from the auxiliary lamps 3109 (FIG. 31a or 31b) may be 5 W/cm² pulsed at a frequency of 1 kHz with a pulse duration of 0.1 ms.

In this example, the cooling is less demanding since the wafer is only at 300° C. when it enters the cooling zone 3106. This is more like the end of the cooling process in Example 16. While the lamp configuration will be similar to that of Example 16, the peak intensities will be higher. As the wafer leaves the hot zone 3105 and passes into the cooling zone 3106, the high peak light intensities for the pulsed light used in the hot zone are maintained at 1 W/cm² or even increased to say 2 W/cm² for the first 20 cm of the cooling zone 3106, ramping up to in the order of 5 W/cm² for the next 50 cm. By the time the wafer has travelled 70 cm into the cooling chamber, the wafer will have been suitably cooled. During this cooling process there was no need to vary the pulse frequency or duration compared to the hot zones. In this case, the lights in the hot zone 3105 would need to tolerate at least 300° C.

Example 18

Pulsing of the Lights to Assist Penetration of H into the Silicon in Conjunction with Electrostatic Fields Established at the Surface of the Silicon Via Charge Deposited within the Dielectric Layer or Applied Electric Fields In this example the same apparatus and pulsing conditions may be used as were used in Example 17, but in this case, the pulsing allows control of the H charge state as it penetrates into the surface of the silicon, therefore allowing its mobility to be drastically increased, assisting the hydrogen to penetrate deep within the silicon. Electrostatic fields or electric fields may be established using the techniques described below in Examples 19 to 25. With the electrostatic field or external electric field established, similar hydrogenation and cool-down procedures would be used as are described in Example 17.

Localised Hydrogenation

Figure 32:
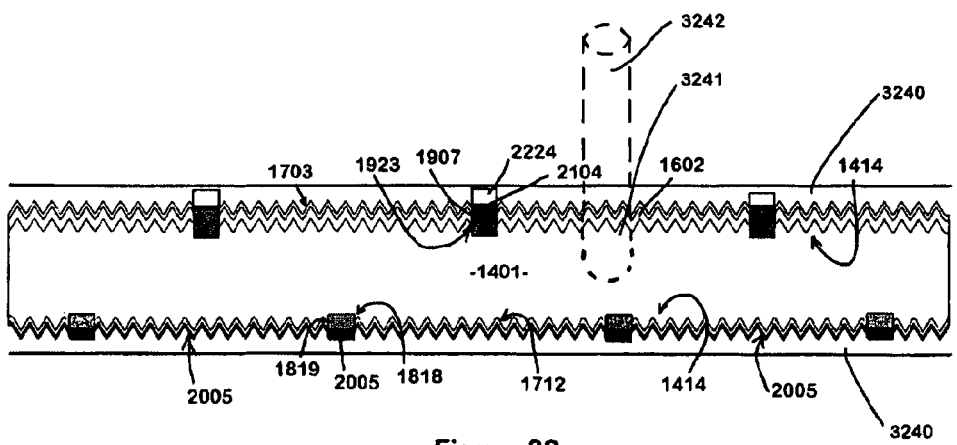
FIG. 32 illustrates and example of localised hydrogenation.

Referring to FIG. 32, a device similar to that of FIG. 22 is illustrated however in this case the device is a finished cell including protective encapsulant 3240 over both surfaces. Localised hydrogenation processing may be performed at any time during the manufacture of a cell and after the cell is completed as shown in FIG. 32. Localised processing involves performing hydrogenation on a small area of the cell to avoid damaging parts of the cell structure that may be damaged either by excessive heat or for which hydrogenation is not appropriate. If larger areas require hydrogenation then this may be achieved incrementally by scanning the heating and lighting source over the areas of the device to be processed at a rate that for example avoids excessive heating of the entire device.

Referring the FIG. 32, heating may be achieved by a laser 3242 which heats and illuminates a small zone 3241 of the device. The laser may be defocused to heat a larger area and to avoid over heating as the laser is scanned slowly over the surface of the device. The laser may also be pulsed to allow further control of temperature and lighting conditions. As the laser moves to a new zone (e.g. by scanning to an adjacent zone), the previous zone will cool quickly as heat is conducted away through the bulk of the device. Therefore direct illumination of the previous zone is not required during the cooling, as the cooling occurs sufficiently quickly that hydrogen charge states created during the heating/illumination of that zone will have a sufficient lifetime to remain present until the zone has cooled sufficiently to avoid reversal of the hydrogenation.

The localised heat and light source may also be another type of light source rather than a laser. For example, the source might be an infra-red light source which is focused and shielded to illuminate only a selected area of the device at any given time. The light source may also be pulsed to control the temperature and illumination levels applied to the zone being hydrogenated.

This technique has the advantage that, provided adequate hydrogen source material was incorporated in the cell at manufacture, it may be used on installed solar cell arrays, amongst other uses, to repair or rejuvenate cells that have degraded in the field. It can also be used during manufacture to avoid damaging cells that progressed to a point in the manufacturing process where excessive heating of the entire device will damage the cell. For example it is possible to treat areas away from the metallisation, while avoiding heating the metallised areas, which if heated excessively could result in the metal penetrating an underlying junction.

Electrostatic Effects to Control the Charge State of Hydrogen in Silicon

In order to get hydrogen into the correct charge state so that it can penetrate deeply into a silicon wafer, the Fermi level at the surface of the wafer can be manipulated to create favourable conditions for hydrogen to take on its neutral charge state ($H^0$). This could be done using electrostatic effects—using a combination of light intensity and charge in the dielectric layer to manipulate the carrier concentration at the surface of the wafer.

Example 19

Figure 33:
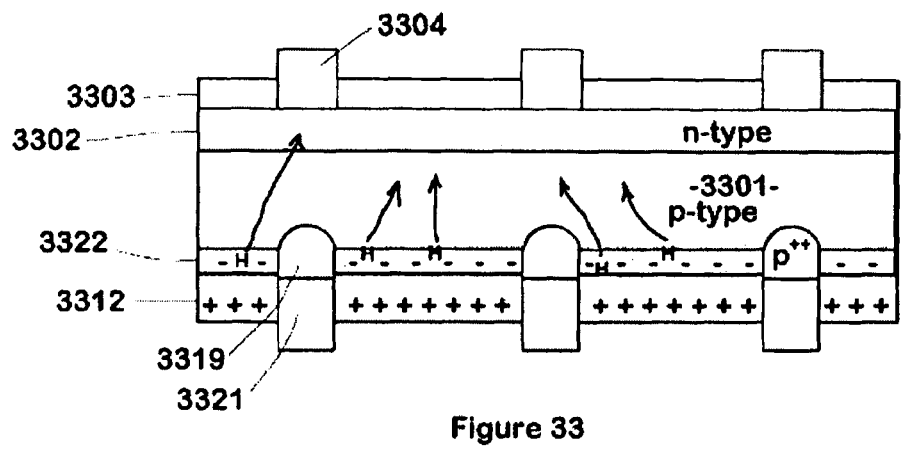
FIGS. 33 to 36 show examples in which electrostatic fields are used to control charge states and movement of hydrogen.

Rear Passivated p-Type Solar Cell with Inversion Layer Induced on Rear by Silicon Nitride and Light or Heat Referring to FIG. 33 a cell formed on a p-type substrate 3301 is illustrated. An n-type emitter 3302 is formed in a top surface with a silicon nitride layer 3303 over the emitter. Metal emitter contacts 3304 extend through openings in the silicon nitride layer 3303 to contact the n-type emitter 3302. A further silicon nitride layer 3312 is formed over the rear surface of the substrate 3301 and heavily doped p-type base contact regions 3319 are formed under openings 3318 in the rear silicon nitride layer 3312. Metal point contacts 3321 pass through the openings in the silicon nitride layer 3312 to contact the heavily doped silicon regions 3319 which isolate the metal point contacts from the bulk of the p-type wafer. Many methods might be used to fabricate a cell of the basic configuration shown in FIG. 33 and, for example, the method described with reference to FIGS. 14 to 22 might be used. A fixed positive charge in the rear silicon nitride layer 3312 can create an electrostatically induced inversion layer 3322 in the p-type silicon, increasing the electron concentration at the surface. Extra positive charge can be added to the rear silicon nitride layer 3312 to increase the inversion. Hydrogenation may then be performed using heat and light to create conditions in which hydrogen is released from the rear silicon nitride layer 3312 into the p-type material. By adjusting light intensity, the carrier concentration at the surface can be controlled such that the Fermi level is at the correct level (ideally close to 0.2 eV above mid-band) where a high concentration of $H^0$ is formed which will be unimpeded by any electric fields or coulombic effects. The same approach can be applied to n-type silicon when using a dielectric with a fixed negative charge such as aluminium oxide.

Example 20

Using a Pulsed Light or Heat Source in the Method of Example 19

Figure 34:
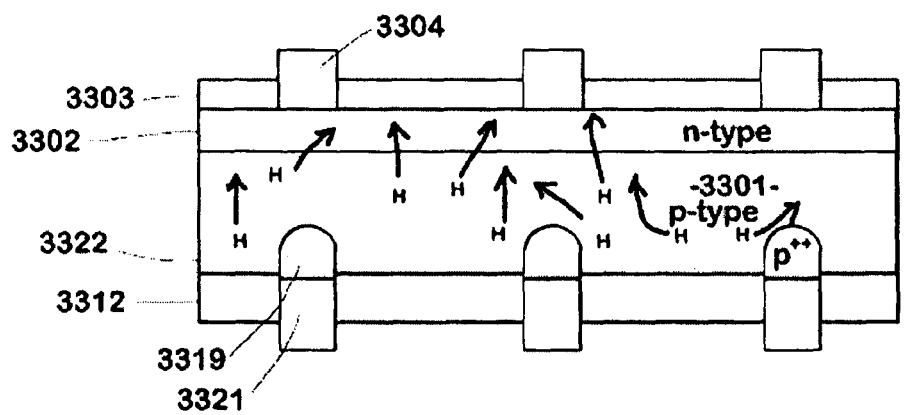

Performing the hydrogenation process of Example 16 above, using pulsed light or heat has the benefit of increasing the carrier concentration at the surface of the wafer to create conditions necessary for forming high concentrations of $H^0$ (ideally the Fermi level will be at close to 0.2 eV above mid-band) while the light or heat is pulsed on (FIG. 33). When the pulse ends (FIG. 34) the silicon returns to its original state but the additional $H^0$ will remain for some time. Also any hydrogen that remains in the inversion layer after the pulse is removed can then move into the p-type silicon unimpeded by electric fields. By pulsing the light or heat source, $H^0$ can be generated whilst not heating the sample to the same extent as when a continuous source of light or heat is used.

As with Example 16, the technique of Example 17 can be applied to n-type silicon when using a dielectric with a fixed negative charge such as aluminium oxide.

Example 21

Figure 35:
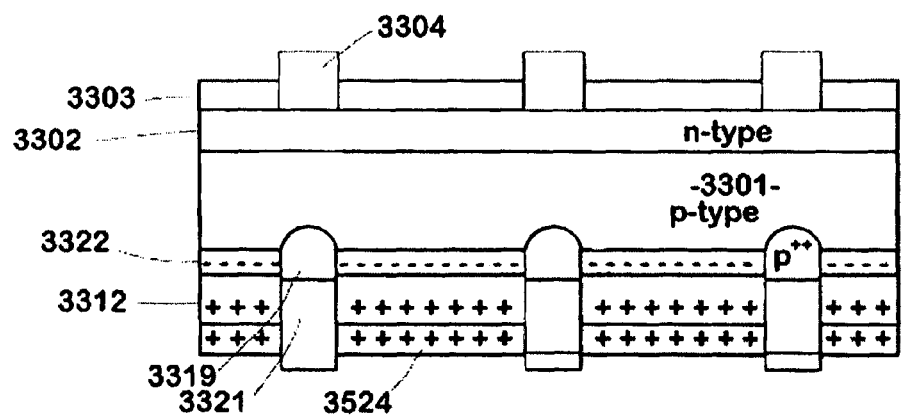

Using Anodic Aluminium Oxide (AAO) Layer Over the Silicon Nitride Layer of Example 19 or 20 to Add Extra Charge and Hydrogen Source Referring to FIG. 35, the use of an anodic aluminium oxide (AAO) layer 3524 on the surface of a silicon nitride film can add an extra hydrogen source as well as an overall increased positive charge in the dielectric stack compared to the use of silicon nitride alone. This can induce a stronger inversion layer in p-type silicon 3301 meaning fewer carriers need to be generated through the use of light or heat to reach an optimum Fermi energy for $H^0$ production.

Example 22

Using an Ionisation Gun to Deliberately Deposit Extra Charge on the Dielectric Layer of Example 19 or 20

Figure 36:
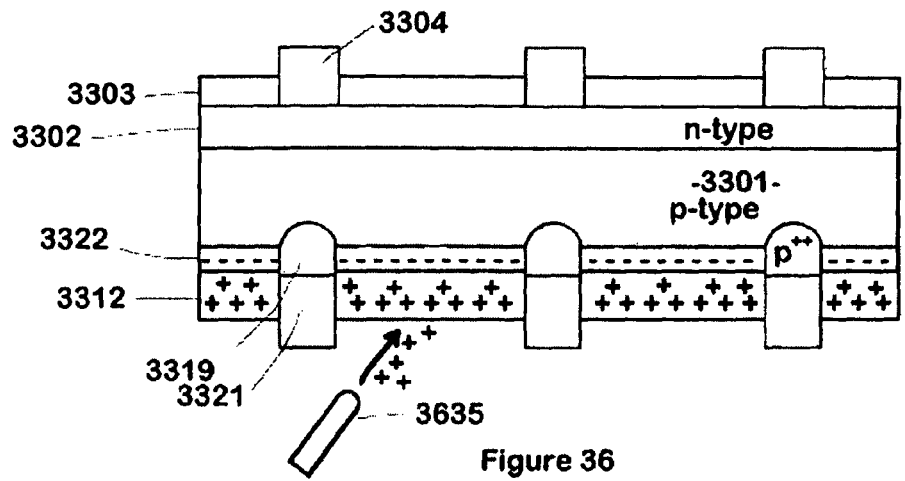

Referring to FIG. 36, an ionisation gun 3625 can be used to deliberately deposit extra charges to the rear dielectric layer 3312, which creates a stronger inversion layer 3322. This can further bend the band gap before the carrier concentration enhancement generated by heat and/or light, and therefore fewer carriers need to be generated through heat or light to reach desired Fermi level for $H^0$ to be generated. The example used here is for p-type, where the extra positive charges are injected onto silicon nitride.

An internal electric field will change the hydrogen charge state to allow it to penetrate deeply into a silicon wafer by diffusion. Application of an external electric field causes hydrogen ions to travel by drifting within silicon wafers: Drift and diffusion of hydrogen can be created simultaneously by creating a potential difference across the wafer while simultaneously directing a light pulse at the dielectric layer 3312.

Example 23

Using an External Electric Field

Figure 37:
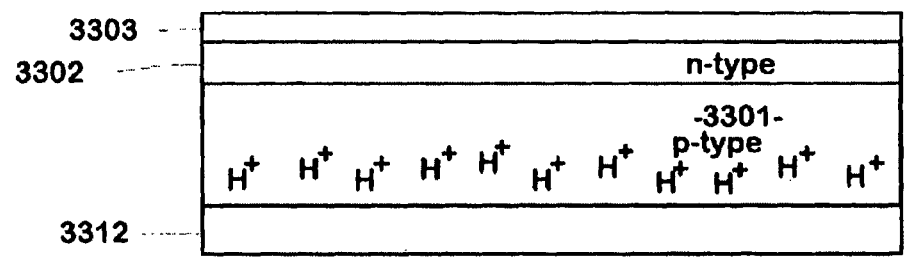
FIGS. 37 to 40 show examples in which external electric fields are used to control charge states and movement of hydrogen.
Figure 38:
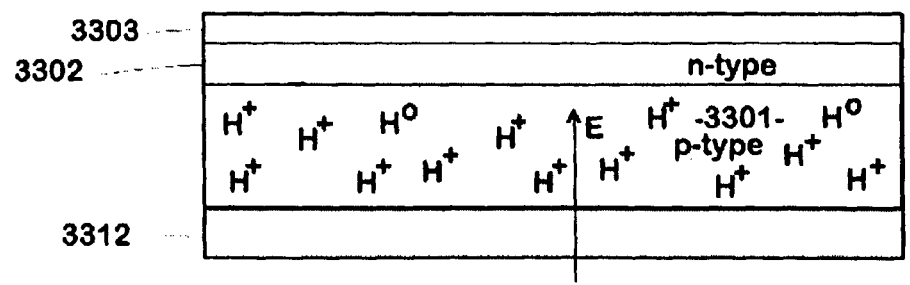

Referring to FIG. 37, we see that, after annealing, $H^+$ has been trapped within the p-type region. By applying an electric field simultaneously with a light pulse (FIG. 38) the movement of H⁺ can be manipulated within the silicon.

Example 24

Using an External Electric Field

Figure 39:
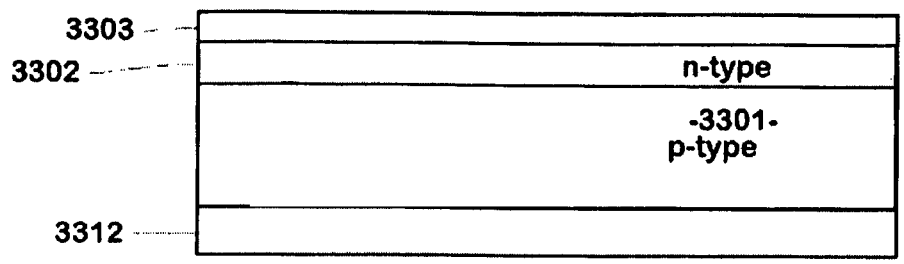
Figure 40:
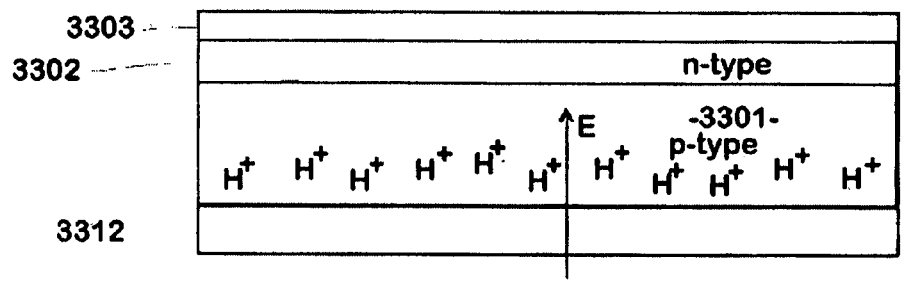

Referring to FIG. 39, using a dielectric layer which provides a source of hydrogen, and applying external electric field (and with light source) onto the dielectric layer, hydrogen is released from the dielectric layer as seen in FIG. 40.

Example 25

Figure 41:
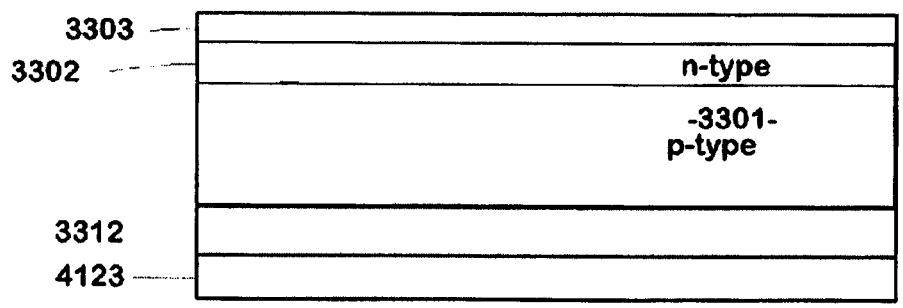
FIG. 41 shows a sample to which an aluminium layer is added in preparation for anodisation to form an anodic aluminium oxide AAO layer.
Figure 42:
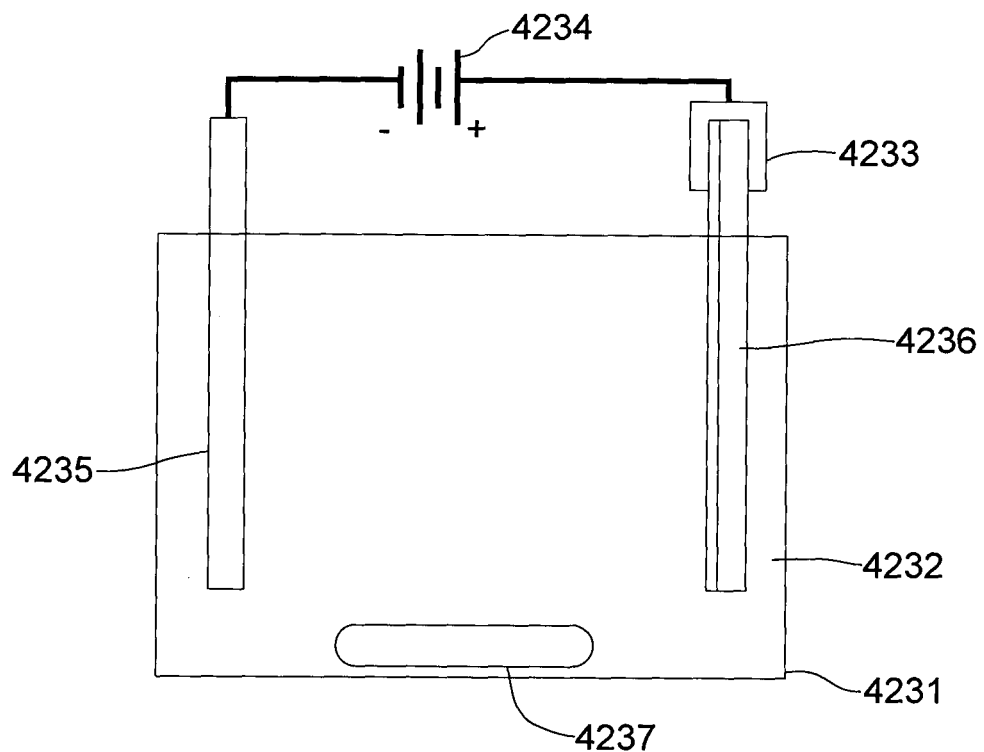
FIG. 42 shows an arrangement for anodising an aluminium layer such as that of FIG. 40.

Using an Applied Electric Field to Silicon Wafers During Anodisation, and Injecting Hydrogen into the Anodised Film to Provide Extra Hydrogen Source Referring to FIG. 41, an aluminium layer 4123 is applied to the rear dielectric layer 3312 ($SiN_x$) and the device is placed into the electrochemical apparatus 4230 illustrated diagrammatically in FIG. 42 where it is anodised. The electrochemical apparatus comprises a tank 4231 containing an acid 4232 into which is inserted a cathode 4235 and a wafer 4236 connected to an anode 4233. The cathode 4235 and anode 4233 are connected to a battery 4234. A stirrer 4237 in the base of the tank ensures even operation of the acid 4232 on the aluminium layer 4128.

Figure 43:
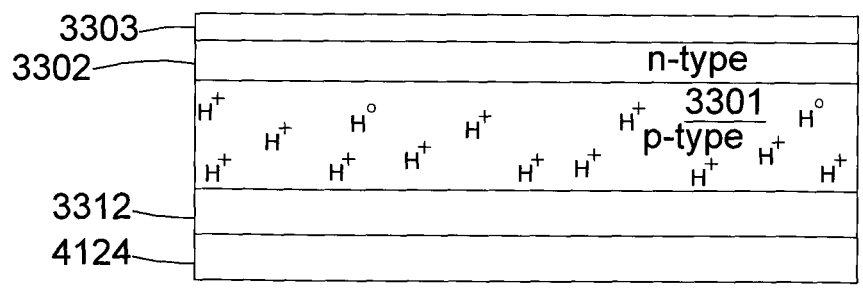
FIG. 43 shows the device of FIG. 40 after anodisation.

FIG. 43 shows the device after anodisation, for example, aluminium anodisation whereby the aluminium layer 4123 is anodised to form an anodic aluminium oxide (AAO) layer 4324.

A test was performed by forming a layer of aluminium on top of 200 nm layer of boron doped amorphous silicon (a-Si) and anodising the aluminium in $D_2O$ at 25 V using the apparatus described above. Secondary ion mass spectrometry (SIMS) analysis has been performed with the results shown in FIGS. 44-46. The results show that hydrogen and deuterium ions ($H^+$ and $D^+$) have been driven into the a-Si layer. There are 5 times more $H^+$ driven into a-Si when the sample has been anodised compared to a reference sample without the AAO layer.

Figure 44:
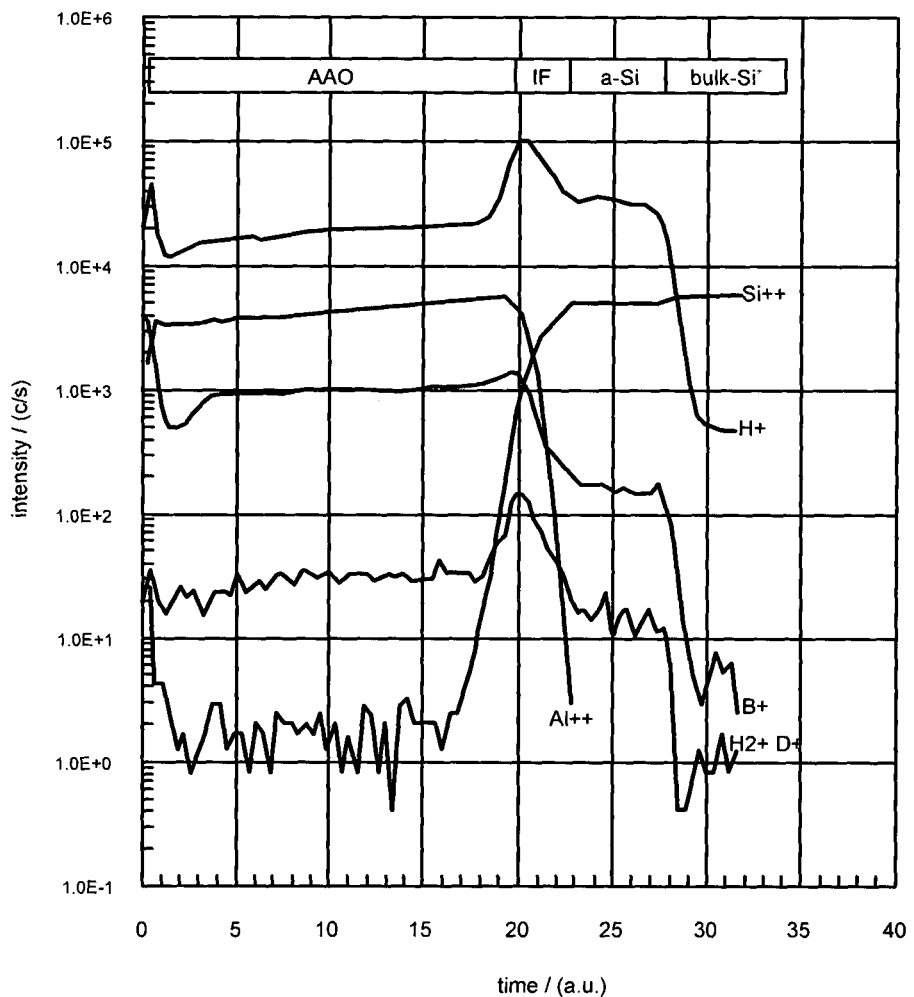
FIG. 44 graphically illustrates a SIMS profile measurement of concentration against time for $Si^{++}$, $H^+$, $B^+$, $Al^{++}$ & $(H_2^+, D^+)$ for the sample of FIG. 43 anodised in $D_2O$ at 25 V.

FIG. 44 graphically illustrates a SIMS profile measurement of concentration against time for $Si^{++}$, $H^+$, $B^+$, $Al^{++}$ & ($H_2^+$,$D^+$) for the sample 4236 anodised in $D_2O$ at 25 V.

Figure 45:
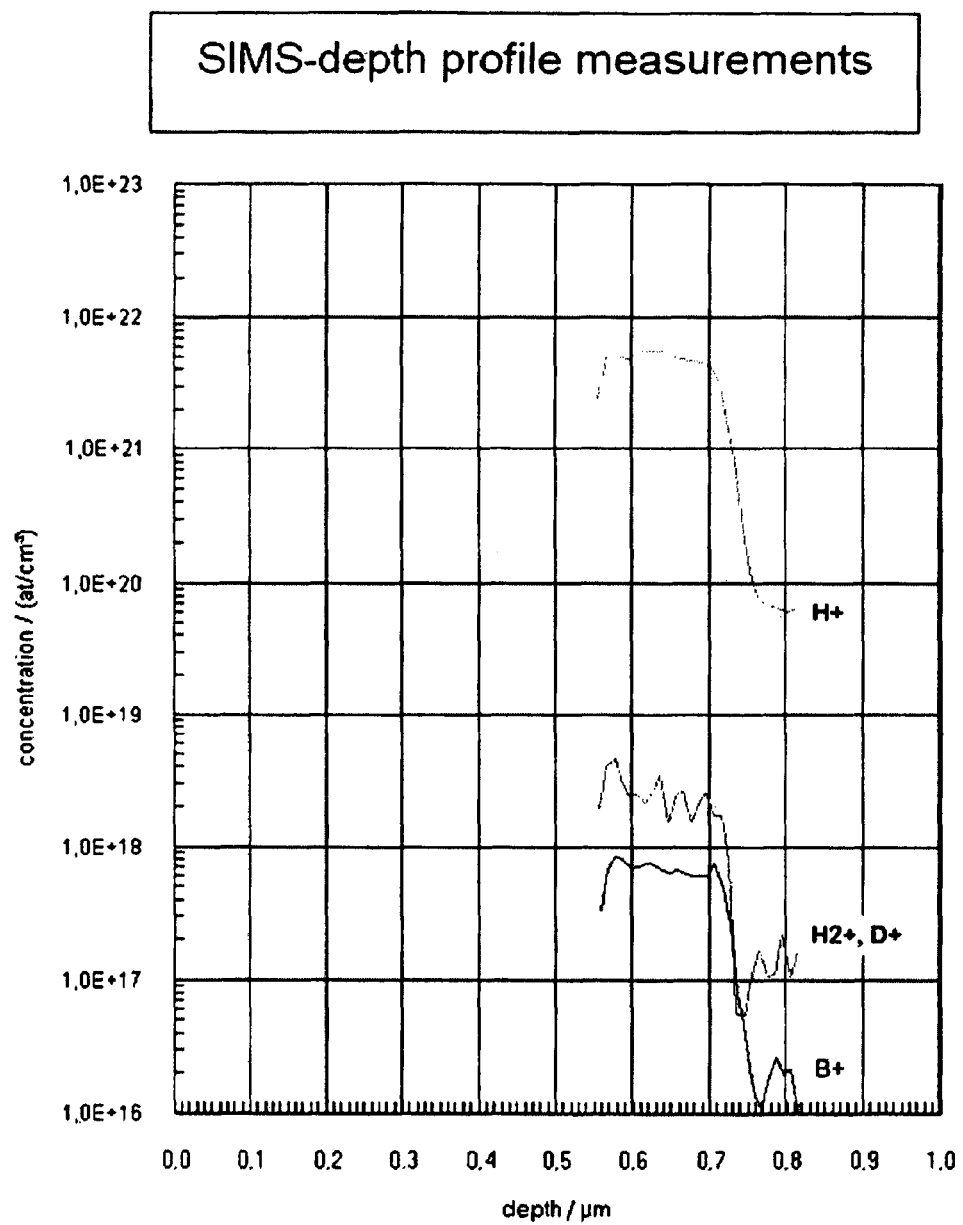
FIG. 45 graphically illustrates a SIMS profile measurement for the sample of FIG. 43 in which intensity of $H^+$ and $D^+$ are converted into concentration in the film of a-Si.

FIG. 45 graphically illustrates a SIMS profile measurement in which intensity of $H^+$ and $D^+$ are converted into concentration in the film of a-Si.

Figure 46:
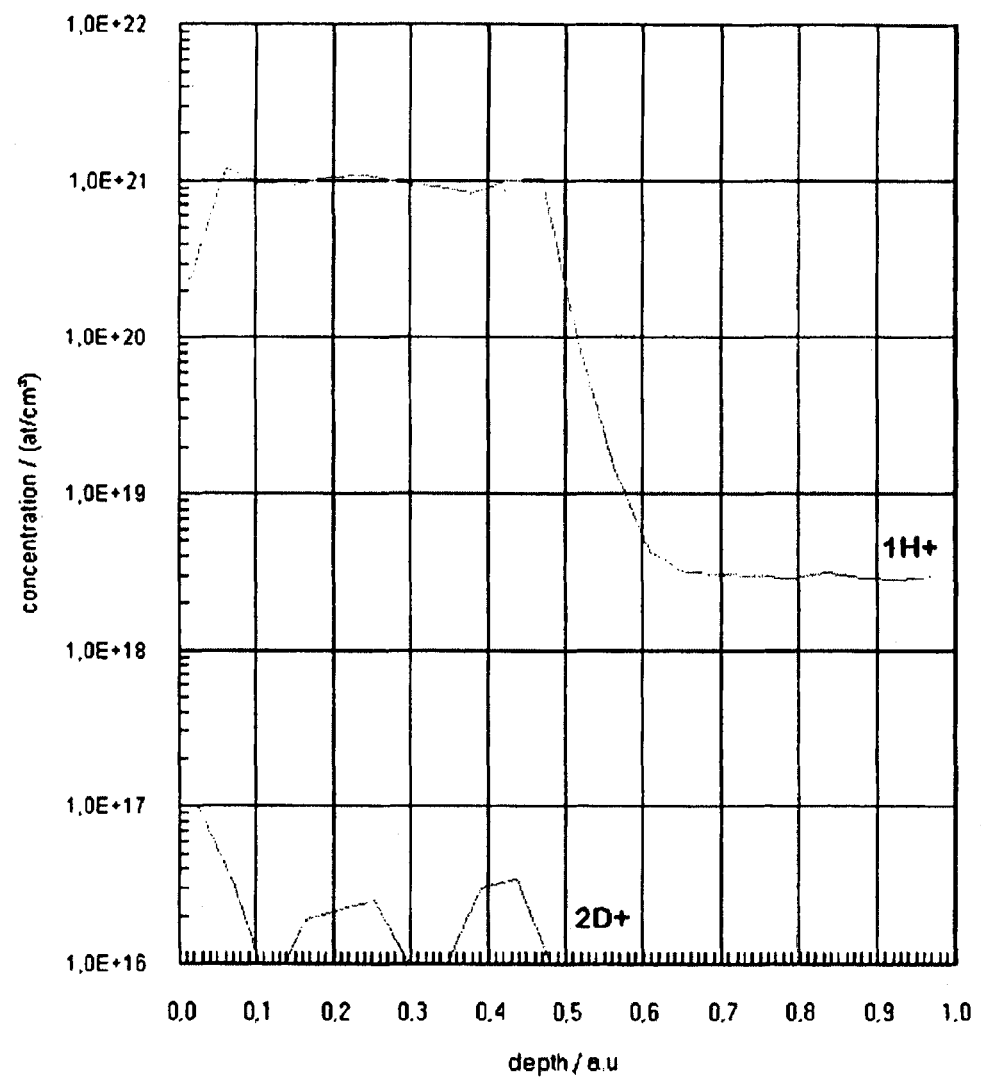
FIG. 46 graphically illustrates a SIMS profile measurement for the sample of FIG. 43 showing a concentration of $H^+$ and $D^+$ in a Reference Sample.

FIG. 46 graphically illustrates a SIMS profile measurement showing a concentration of $H^+$ and $D^+$ in a Reference Sample.

The invention claimed is:

1. A method of processing silicon, with a hydrogen source present, for use in the fabrication of a photovoltaic device having at least one rectifying junction, the method comprising heating at least a region of the device to at least 100° C. while simultaneously illuminating at least some of the device with at least one light source whereby the cumulative power of all the incident photons with sufficient energy to generate electron hole pairs within the silicon is at least 20 mW/cm².

2. The method of claim 1 wherein photons generated by the at least one light source having sufficient energy to generate electron hole pairs in the silicon comprise at least 70% of the total cumulative power of all photons incident on the device from the at least one light source.

3. The method as claimed in claim 1 wherein the heating of the device is provided to at least 200° C.

4. The method as claimed in claim 1 wherein the method further comprises ensuring that any silicon surface n-type doped layers through which hydrogen must diffuse have peak doping concentrations of $1 \times 10^{20}$ atoms/cm3 or less.

5. The method as claimed in claim 1 the method further comprising ensuring that any silicon surface p-type doped layers through which hydrogen must diffuse have peak doping concentrations of $1 \times 10^{19}$ atoms/cm3 or less.

6. The method as claimed in claim 1 the method further comprising providing one or more hydrogen sources accessible by a front surface and a rear surface of the device.

7. The method as claimed in claim 1 wherein the hydrogen source is a hydrogen source contained within the device.

8. The method as claimed in claim 1 wherein the hydrogen source is a hydrogen source located externally of the device.

9. The method as claimed claim 1 wherein the step of heating of the device to at least 100° C. is followed by cooling of the device, and illumination is varied during the cooling, to control the amount of hydrogen in a given charge state.

10. The method as claimed in claim 9 wherein illumination is maintained or varied during the cooling step, until the temperature is reduced to below a predetermined threshold.

11. The method as claimed in claim 9 wherein illumination is maintained or varied during the cooling step, until the temperature is reduced back below 100° C.

12. The method as claimed in claim 1 wherein after a processes is performed at temperatures greater than 200° C., after a hydrogenation process has been performed on the device, the device is cooled and illumination of the device with a hydrogen source present is continued while the device cools.

13. The method as claimed in claim 1 wherein an intensity of illumination applied to the device is varied during the hydrogenation or other thermal process.

14. The method as claimed in claim 1 wherein during a hydrogenation process, or during a process performed at greater than 200° C. after hydrogenation and/or during cooling after such a process, illumination applied to the device is pulsed.

15. The method as claimed in any claim 1 wherein the intensity of illumination applied to the device is controlled to maintain the Fermi level at a value of 0.5 to 0.22 ev above mid-gap.

16. The method as claimed in claim 1 wherein the heating of the device is provided to at least 300° C.

17. The method as claimed in claim 1 wherein the hydrogen sources comprise a layer or layers of PECVD deposited material containing oxygen.

18. The method as claimed in claim 1 wherein hydrogen atoms passivate recombination sites within the device to increase wafer minority carrier lifetimes.

19. The method as claimed in claim 17 wherein hydrogen atoms passivate recombination sites within the device to increase wafer minority carrier lifetimes by at least a factor of two.

20. The method as claimed in claim 1 wherein after heating the device, the device is rapidly cooled by blowing cool air onto the device.

21. The method as claimed in claim 1 wherein a localised region which is hotter than a remainder of the device is rapidly cooled by transfer of heat to the remainder of the device acting as a heat sink.

* * * * *